United States Patent [19]
Nose et al.

[11] Patent Number: 5,440,394
[45] Date of Patent: Aug. 8, 1995

[54] LENGTH-MEASURING DEVICE AND EXPOSURE APPARATUS

[75] Inventors: Noriyuki Nose, Atsugi; Kenji Saito, Yokohama; Mitsuaki Amemiya, Isehara, all of Japan

[73] Assignee: Canon Kabushiki Kaisha, Tokyo, Japan

[21] Appl. No.: 193,880

[22] Filed: Feb. 9, 1994

Related U.S. Application Data

[63] Continuation of Ser. No. 874,831, Apr. 28, 1992, abandoned.

[30] Foreign Application Priority Data

May 1, 1991 [JP] Japan .................................. 3-130451
Apr. 21, 1992 [JP] Japan .................................. 4-128334

[51] Int. Cl.⁶ ........................ G01B 11/02; G01B 11/26
[52] U.S. Cl. .................................... 356/384; 250/548; 355/53; 356/401
[58] Field of Search ............... 356/363, 372, 375, 384, 356/400, 401; 355/53; 250/548

[56] References Cited

U.S. PATENT DOCUMENTS

| | | |
|---|---|---|
| 4,877,359 | 10/1989 | Kolacek . |
| 4,918,320 | 4/1990 | Hamasaki et al. ............ 250/548 |
| 5,028,797 | 7/1991 | Abe et al. ..................... 250/548 |

FOREIGN PATENT DOCUMENTS

| | | |
|---|---|---|
| 63-38102 | 2/1988 | Japan . |
| 64-89323 | 4/1989 | Japan . |
| 1101630 | 4/1989 | Japan . |
| 1108741 | 4/1989 | Japan . |
| 1191421 | 8/1989 | Japan . |
| 1200620 | 8/1989 | Japan . |
| WO8604158 | 7/1986 | WIPO . |

OTHER PUBLICATIONS

Patent Abstracts of Japan, vol. 12, No. 293, on English Abstract published Aug. 10, 1988 of Japanese Patent No. 63-70420.
IBM Technical Disclosure Bulletin, H. Herd, et al., Method and Apparatus of In Situ Measurement and Overlay Error Analysis for Correcting Step and Repeat Lithographic Cameras, vol. 26, No. 9, Feb. 1984, pp. 4855-4859.
Patent Abstracts of Japan, vol. 13, No. 198, an English Abstract published May 11, 1989 of Japanese Patent No. 64-19723.
Journal of Vacuum Science & Technology, vol. 16, No. 6, Nov. Dec. 1979, pp. 1954-1958, "Optical Alignment System for Submicron X-Ray Lithography", Fay et al.
Optical Engineering, vol. 22, No. 2, Mar./Apr. 1983, pp. 203-207, "Application of Zone Plates to Alignment in X-Ray Litography", Feldman et al.

*Primary Examiner*—F. L. Evans
*Attorney, Agent, or Firm*—Fitzpatrick, Cella, Harper & Scinto

[57] ABSTRACT

A length measuring device for performing length measurement and an exposure apparatus for performing an exposure operation on a first object having a plurality of alignment patterns thereon, includes an alignment detector for detecting the relative positional relation between the first object and a second object having a plurality of reference alignment patterns used for aligning the first object therewith, and for detecting an alignment condition between the alignment patterns of the first and second objects, a movement device for moving the first and second objects relative to each other, a measurement device for measuring the amount of movement of the movement device, and a length measurement device for performing measurement of the space between the plurality of alignment patterns formed on the first object. The length measurement device performs length measurement on the basis of successive alignment conditions detected by successive alignment condition detection operations of the alignment detector between the plurality of reference alignment patterns on the second object and the plurality of alignment patterns on the first object, as well as the amount of movement of the movement device measured by the measurement device during the successive alignment condition detection operations of the alignment detector.

17 Claims, 19 Drawing Sheets

LENGTH-MEASURING DEVICE AND EXPOSURE APPARATUS

This application is a continuation of application Ser. No. 07/874,831 filed Apr. 28, 1992.

BACKGROUND OF THE INVENTION

1. Field of the Invention

The present invention relates to a length-measuring device for measuring, with a high degree of accuracy, space. intervals between the patterns formed by, for example, an exposure apparatus which is used in semiconductor device manufacturing, as well as to an exposure apparatus which employs the same.

2. Description of the Related Art

Measurements of intervals of the patterns formed by an electron beam, a light beam or X-ray exposure apparatus are essential for highly accurate evaluation of the dimensional distortions brought about by that exposure apparatus and that exposure apparatus's pattern forming process. In, for example, a photo stepper, distortions in a photographing system, such as an optical system for forming a demagnified image of a reticle onto a wafer, or distortions resulting from inaccuracy in the placement of the stage or the wafer which appear in the pattern formed on the wafer. Where a high degree of integration ensuring patterned lines of submicron width is required, such distortions must be measured to an accuracy of 0.01 μm or less, and means for measuring the distance between the patterns to a corresponding accuracy must be provided.

Conventionally, the distance between the patterns is measured by projecting converged rays of light onto pattern P on wafer U, as shown in FIG. 1 (a), and by observing the light scattered from an edge of the pattern P. That is, a converged laser beam La scans the pattern P, which is an object to be measured, formed on the wafer U which is an object to be detected, perpendicular to the pattern P. The light scattered from the edge of the pattern P is detected by a pair of detectors D1 and D2, and line width W or the distance between the patterns P is detected from the scanning distance of the laser beam La, as shown in FIG. 1 (b).

However, such a measuring method causes problems with resist patterns employed in an actual wafer process, because they may not have a clear edge; rather, the contour thereof may have an unclear edge. Consequently, errors of 0.1 to 0.2 μm may be generated between the measured value and the true value. This precludes accurate evaluation of the distortions of an optical printing system by using the dimension between the patterns.

SUMMARY OF THE INVENTION

It is an object of the present invention to overcome the problems of the prior art.

In view of the aforementioned drawbacks of the prior art, it is an object of the present invention to provide a length measuring device which is capable of measuring the space interval between patterns with a high degree of accuracy even when, for example, a resist pattern is used, and to provide an exposure apparatus having such a length measuring function.

According to one aspect, the present invention which achieves these objectives relates to a length measuring device for performing length measurement on a first object which is an object to be detected, the first object having a plurality of alignment patterns thereon. The device comprises alignment detection means for detecting the relative positional relation between the first object and a second object having reference alignment patterns used for aligning the first object therewith. The alignment detection means detects an alignment condition between the alignment patterns of the first and second objects. The device further comprises movement means for moving the first and second objects relative to each other, measurement means for measuring the amount of movement of the movement means, and length measurement means for performing measurement of the space between the plurality of alignment patterns formed on the first object. The length measurement means performs length measurement on the basis of the successive alignment conditions detected by successive alignment condition detection operations of the alignment detection means between the plurality of reference alignment patterns on the second object and the plurality of alignment patterns on the first object, as well as the amount of movement of the movement means measured by the measurement means during the successive alignment condition detection operations of the alignment detection means.

The alignment detection means can include a light source for generating inspection rays of light and a photo detecting element for detecting the inspection rays of light which have passed through at least one alignment pattern on the first object and at least one reference alignment pattern on the second object. The alignment detection means optically detects the alignment conditions between the alignment patterns of the first and second objects. The alignment detection means can detect the alignment condition from a position on the photo detection element on which the inspection rays of light are incident or from the intensity of light of the inspection rays of light incident on the photo detection element.

According to another apse, the present invention which achieves these objectives relates to an exposure apparatus for performing an exposure operation on a first object which is an object to be detected, the first object having a plurality of alignment patterns thereon. The apparatus comprises alignment detection means for detecting the relative positional relation between the first object and a second object having a plurality of reference alignment patterns used for aligning the first object therewith. The alignment detection means detects an alignment condition between the alignment patterns on the first and second objects. The apparatus further comprises movement means for moving the first and second objects relative to each other, the movement means performing movement of the first and second objects such that the first and second objects are aligned with each other on the basis of the result of detection by the alignment detection means. An exposure operation is conducted on the aligned first and second objects. The apparatus further comprises measurement means for measuring the amount of movement of the movement means, and length measurement means for performing measurement of the space between the plurality of patterns formed on the first object. The length measurement means performs length measurement on the basis of successive alignment conditions detected by successive alignment condition detection operations of the alignment detection means between the plurality of reference alignment patterns on the second object and the plurality of alignment patterns on the first object, as well as the amount of movement of the movement detection means measured by the measurement means during the successive alignment condition detection operations of said alignment detection means.

The alignment detection means includes a light source for generating inspection rays of light and a photo detecting element for detecting the inspection rays of light which have passed through at least one alignment patterns on the first object and at least one reference alignment pattern on the second object, the alignment detection means optically detecting the alignment condition between the alignment patterns of the first and second objects. In this embodiment, the alignment detection means can detect the alignment condition from a position on the photo detection element on which the inspection rays of light are incident or from the intensity of light of the inspection rays of light incident on the photo detection means.

According to another aspect, the invention which achieves these objectives relates to a length measuring device for performing length measurement on a first object which is an object to be detected, the first object having a plurality of alignment patterns. The device comprises an alignment detection optical system for detecting the relative positional relation between the first object and a second object having a plurality of reference alignment patterns used for aligning the first object therewith. The alignment detection optical system optically detects an alignment condition between the alignment patterns of the first and second objects. The device further comprises a stage for moving the first and second objects relative to each other and a length measuring unit for measuring the amount of movement of the stage. Measurement of the space between the plurality of patterns on the first object is conducted by detection the amount of movement of the stage by the length measuring unit between successive alignment condition detecting operations of the alignment detection means between the plurality of reference alignment patterns on the second object and the plurality of alignment patterns on the first object.

Other objects and advantages of the invention will become apparent during the following description taken in connection with the accompanying drawings.

DETAILED DESCRIPTION OF THE PREFERRED EMBODIMENTS

A length measuring device, according to an embodiment which will be described in detail later, includes alignment detection means for optically detecting an aligned state between an alignment pattern of a first object, which is an object to be detected, having a plurality of alignment patterns and an alignment pattern of a second object having reference alignment patterns, moving means for moving the first and second objects relative to each other, and length measuring means for measuring an amount of movement of the moving means. The distance between the patterns is measured from the detection of the aligned states between at least some of the plurality of patterns of the first object and the alignment patterns of the second object, which is conducted by the alignment detection means, and from the measurement by the length measurement means.

An exposure apparatus, according to an embodiment which will be described in detail later, detects an aligned state between an alignment pattern of a first object, which is an object to be detected, having a plurality of alignment patterns and an alignment pattern of a second object having reference alignment patterns, aligns the first and second objects with each other on the basis of the results of the detection, and performs an exposure operation. The exposure apparatus comprises auto-alignment detection means for optically detecting the aligned state, moving means for moving the first and second objects relative to each other, and length measurement means for measuring the amount of movement of the moving means. The distance between the patterns is measured from the detection of aligned states between at least some of the plurality of patterns of the first object and the alignment patterns of the second object. This measurement is conducted by the alignment detection means, and from the measurement by the length measurement means.

In the length measuring device and exposure apparatus arranged in the manner described above, the positional deviation between the first object, which is the object to be detected, having the alignment patterns, and the second object having the reference patterns, is detected by the auto-alignment detection means while the first and second objects are being moved relative to each other, and the amount of movement which assures a predetermined positional deviation is measured, by which the space interval between the patterns is obtained.

Figure 1A:
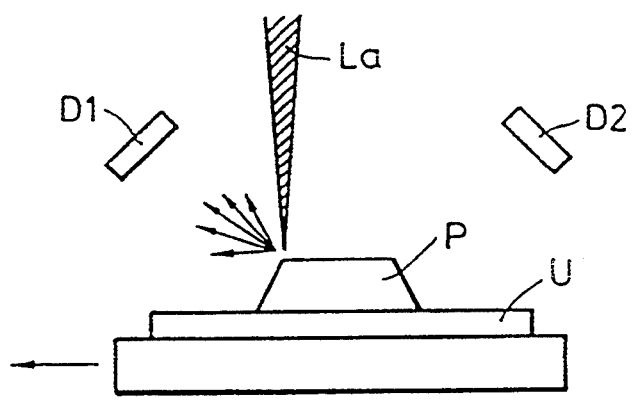
FIG. 1 (a) and FIG. 1 (b) illustrate a conventional technique for measuring the distance between patterns.
Figure 1B:
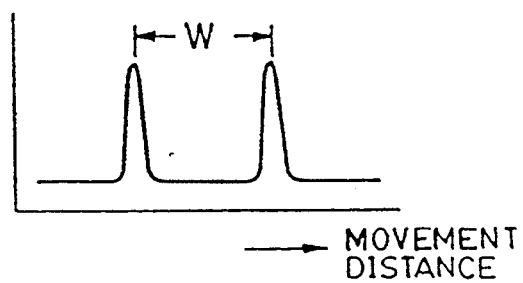

The aforementioned structure is characterized by the use of the auto-alignment operation to perform a photo probe corresponding to the function. of detecting the light scattered from an edge, shown in FIG. 1. Such an auto-alignment detection operation can be performed using any of the following methods.

(1) The first method is a method of performing alignment utilizing a zone plate pattern which has the function of converging diffracted light. An application on this auto-alignment method has already been filed by the present applicants as Ser. No. 754,304.

(2) The second method is a so-called double diffraction grating method of performing alignment by detecting the intensity of special light generated by diffracted light obtained by linear gratings provided on a mask and a wafer, respectively. This method has been disclosed in Japanese Patent Laid-Open Nos. Sho 63-38102 and Sho 64-89323.

(3) The third method is a method of performing alignment by detecting respective diffracted light coming from the zone plates respectively provided on a mask and a wafer. This method has been made public in Optical Engineering March/April 1983 VOL. 22 No. 2 on p. 203.

(4) The fourth method is a method of performing alignment by providing a grating on a mask for generating diffracted light having the same function as that of a cylindrical lens and a sequence-of-points grating pattern on a wafer and by detecting the intensity of light obtained by diffraction caused by the patterns on the mask and the wafer. This method has been described in Journal of Vacuum. Science and Technology 16(6) November/December 1979 p. 1964 and Japanese Patent Laid-Open No. Hei 1-108741.

(5) The fifth method is an alignment method in which images of patterns provided on a mask and a wafer are formed on an image sensor by an optical system, and in which the positional deviation is detected by processing the image obtained by the image sensor. This method has been disclosed in Japanese Patent Laid-Open Nos. Hei 1-1630, Hei 1-200620 and Hei 1-191421.

The following matters are common to the aforementioned alignment methods.

(a) A pattern is provided on each of the objects which are to be aligned with each other.

(b) A detection signal is obtained to determine an aligned state between the mask and the wafer. The detection accuracy thereof is as high as 0.01 μm or higher.

(c) The pattern is formed on each of the mask and wafer on a fixed pattern area having dimensions of, for example, at least 50 μm × 20 μm or at least 2 μm × 50 μm. The value of the signal is determined by the average state of the patterns on these pattern areas.

(d) Incompleteness or non-sharpness of the edge of the pattern affects the absolute intensity of the signal in terms of the diffraction efficiency, and hence does not lead to a reduction in accuracy. Thus, more highly accurate measurement of the position or dimensions of the patterns is possible as compared with the method shown in FIG. 1.

Embodiments of the present invention will now be described in detail with reference to FIGS. 2 through 17.

Figure 2:
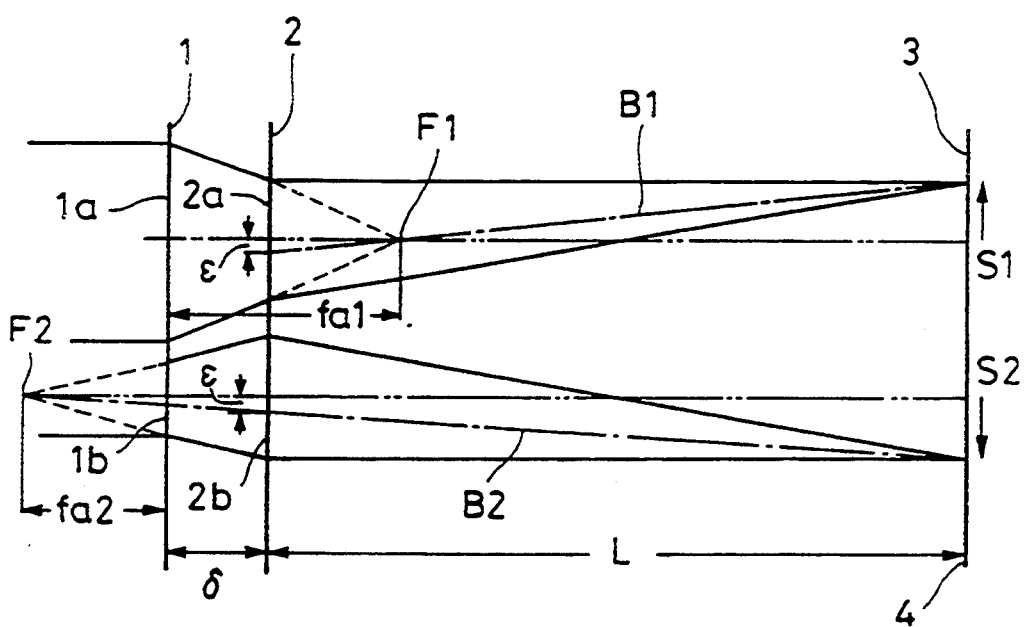
FIG. 2 illustrates a schematic view of the detection principle of an auto-alignment detection method of the present invention.

FIG. 2 illustrates the principle of detecting the positional deviation between a mask 1 and a wafer 2 from an interval between spots obtained by patterns provided on the mask 1 and the wafer 2 as zone plates whose diffracted light have the same function as that of a lens. The mask 1 and the wafer 2 have alignment marks 1$a$ and 2$a$, respectively, to obtain first signal light rays B1. The mask 1 and the wafer 2 also have alignment marks 1$b$ and 2$b$, respectively, for providing second signal light rays B2. Each of the alignment marks 1$a$, 1$b$, 2$a$ and 2$b$ has the function of a physical optical element which may be a Fresnel zone plate or a grating lens having the function of a one- or two-dimensional lens. First and second detecting portions 3 and 4 of the alignment apparatus are provided in such a manner that they respectively face the alignment marks 1$a$ and 2$a$, and 1$b$ and 2$b$ to detect the first and second signal light rays B1 and B2, respectively. For convenience of explanation, the optical distance between the detecting portion 3 or 4 and the wafer 2 is denoted by L. The distance between the mask 1 and the wafer 2 is denoted by $\delta$. The focal lengths of the alignment marks 1$a$ and 1$b$ are denoted by fa1 and fa2, respectively. The relative positional deviation between the mask 1 and the wafer 2 is denoted by $\epsilon$. The amounts of displacement of the centers of gravity of the first and second signal light rays B1 and B2 from a focused state at the detecting portions 3 and 4 are expressed by S1 and S2, respectively. It is assumed for the convenience of explanation that the alignment light beam which is incident on the mask 1 is a plane wave and that the light rays B1 and B2 pass through the alignment marks and are thereby diffracted.

The amounts of displacement S1 and S2 of the centers of gravity of the signal light rays B1 and B2 are geometrically obtained as intersections of lines where the straight lines which connect the focal points F1 and F2 of the alignment marks 1$a$ and 1$b$ to the centers of the optical axes of the alignment marks 1$a$ and 1$b$ cross the light receiving surfaces of the detecting portions 3 and 4. Thus, the signs of the amounts of displacement S1 and S2 of the centers of gravity of the signal light rays B1 and B2 can be made opposite to each other relative to the relative positional deviation between the mask 1 and the wafer 2 by using the optical image forming magnifications of the alignment marks 1$a$ and 1$b$ having opposite signs. Quantitatively, the amounts of displacement S1 and S2 are expressed as follows:

$$S1 = -\{(L-\text{fa}1+\delta)/(\text{fa}1-\delta)\}\cdot\epsilon$$

$$S2 = -\{(L-\text{fa}1+\delta)/(\text{fa}1-\delta)\}\cdot\epsilon$$

The positional deviation magnifications, $\beta 1$ and $\beta 2$, are thus defined as $\beta 1 = S1/\epsilon$, $\beta 2 = S2/\epsilon$.

To make the signs of the positional deviation magnifications opposite to each other, the following conditions must be satisfied:

$$(L-fa1+\delta)(fa2-\delta)/\{(L-fa2+\delta)(fa1-\delta)\} < 0$$

Of the above-mentioned conditions, the following conditions are practically satisfied:

$$L \gg |fa1|$$

$$fa1/fa2 < 0$$

$$|fa1| > \delta$$

$$|fa2| > \delta$$

That is, the distance L to the detecting portions 3 and 4 is made large while the distance $\delta$ between the mask 1 and the wafer 2 is made small relative to the focal lengths fa1 and fa2 of the alignment marks 1a and 1b. Also, one of the alignment marks 1a and 1b is made convex, and the other is made concave.

In the upper portion of the structure shown in FIG. 2, the alignment mark 1a causes rays of light which are incident thereon to converge. The converging rays of light irradiate the alignment mark 2a before they reach a focal point F1. The alignment mark 2a forms an image of the incident light on the first detecting portion 3. In this case, the focal length fb1 of the alignment mark 2a is determined such that it satisfies the following equation:

$$1/(fa1-\delta)+1/L=-1/fb1$$

Similarly, in the lower portion of the structure shown in FIG. 2, the alignment mark 1b causes rays of light which are incident thereon to diverge such that they appear to come from a point F2 located on the incident side of the alignment mark 1b. The alignment mark 2b forms an image of the diverged rays of light on the second detecting portion 4. The focal length fb2 of the alignment mark 2b is determined such that it satisfies the following equation:

$$1/(fa2-\delta)+1/L=-1/fb2$$

As can be seen from the above-described conditions shown in FIG. 2, since the image forming magnifications of the alignment marks 1a and 2a relative to the converged image are positive, the direction of the positional deviation $\epsilon$ of the wafer 2 is opposite to that of the amount of displacement S1 of the light spot on the detecting portion 3, and the previously defined deviation magnification $\beta1$ is thus negative. Similarly, since the image forming magnification of the alignment mark 2b relative to the point image (virtual image) is negative, the direction of the positional deviation $\epsilon$ of the wafer 2 is the same as that of the amount of displacement S2 of the light spot on the detecting portion 4, and the deviation magnification $\beta2$ is thus positive. Thus, the amounts of deviation S1 and S2 of the signal light rays obtained by the system consisting of the alignment marks 1a and 2a and the system consisting of the alignment marks 1b and 2b, respectively, are in the opposite directions relative to the relative positional deviation e between the mask 1 and the wafer 2.

Figure 3:
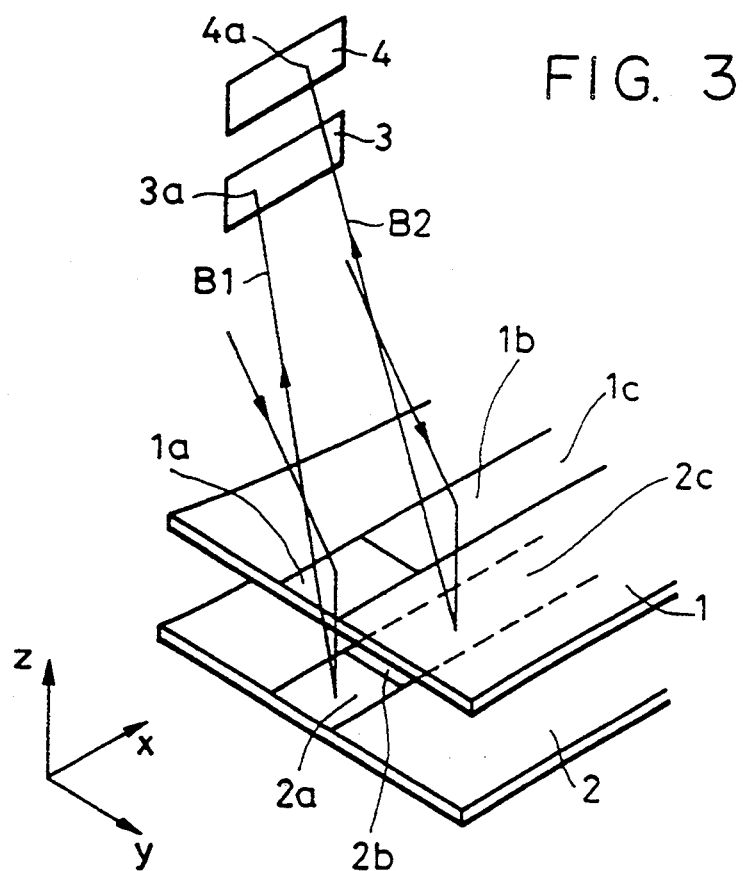
FIG. 3 illustrates a schematic view of the layout of the auto-alignment detection system.
Figure 4:
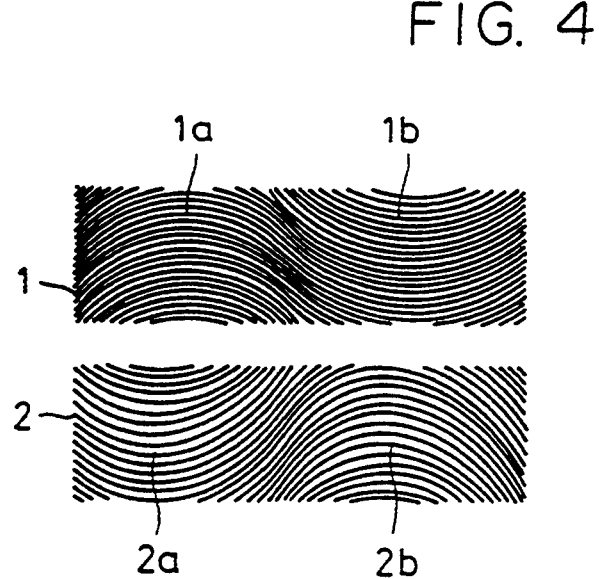
FIG. 4 is a plan view of alignment patterns.

FIG. 3 illustrates the layout of the structure shown in FIG. 2. In FIG. 3, members corresponding to those shown in FIG. 2 are designated by the same reference characters. FIG. 3 schematically shows the relation between the positional deviation between the mask 1 and the wafer 2 and the difference between the output signals of the detecting portions 3 and 4, i.e., the space between the incident positions of the signal light rays B1 and B2 on the detecting portions 3 and 4 in a direction of the axis x, which is the auto-alignment direction. The alignment marks 1a, 1b and 2a, 2b are respectively provided on a scribe line 1c on the mask 1 and on a scribe line 2c on the wafer 2. The alignment marks 1a, 1b, 2a and 2b are Fresnel zone plates or grating lenses having different focal lengths, as shown in FIG. 4. Practical dimensions of each of the marks 1a through 2b are between 50 and 300 $\mu$m in the direction of the scribe lines 1c and 2c (in the x direction) and between 20 and 100 $\mu$m in the direction of the width of the scribe lines 1c and 2c (in the y direction).

Each of the first and second signal light rays B1 and B2 emanates from a light source incorporated in a pick-up casing and is collimated into a light beam having a predetermined diameter. A light source for producing coherent rays of light, such as a semiconductor laser, a He-Ne laser or an Ar laser, or a light source for producing incoherent light rays, such as a light-emitting diode, can be employed as the light source. Each of the detecting portions 3 and 4 for respectively detecting the first and second signal light rays B1 and B2 is constituted by a one-dimensional CCD.

In this embodiment, after the signal light rays B1 and B2 are made incident on the alignment marks 1a and 1b on the mask 1, respectively, at predetermined angles, they pass through the alignment marks 1a and 1b and are thereby diffracted. The signal light rays B1 and B2 are then reflected by the alignment marks 2a and 2b on the wafer 2 (unlike the case shown in FIG. 2), pass through the mask 1, and are then made incident on positions 3a and 4a of the detecting portions 3 and 4. The detecting portions 3 and 4 detect the centers of gravity of the signal light rays B1 and B2 incident thereon, and thereby detect the positional deviations of the patterns 1a, 1b, 2a and 2b of the mask 1 and wafer 2 using output signals thereof (which may be a value of S1−S2). Practically, $\epsilon$ may be calculated from the obtained S1−S2 using equation $\epsilon=(S1-S2)/(\beta1-\beta2)$.

When the positional deviation is zero, the centers of gravity of the light rays B1 and B2, i.e., the output signals of the detecting portions 3 and 4, are determined using, as zero deviation, the signal value obtained beforehand as, for example, a state between the mask 1 and the wafer 2. For example, the space interval between the positions at which the two light rays B1 and B2 are made incident on the detecting portions 3 and 4 in the direction of x is obtained, and this space interval is made a standard space interval for $S_1-S_2=0$. A variation of the space interval obtained in an actual measurement from the standard space interval is set as the value of $S_1-S_2$.

Figure 5:
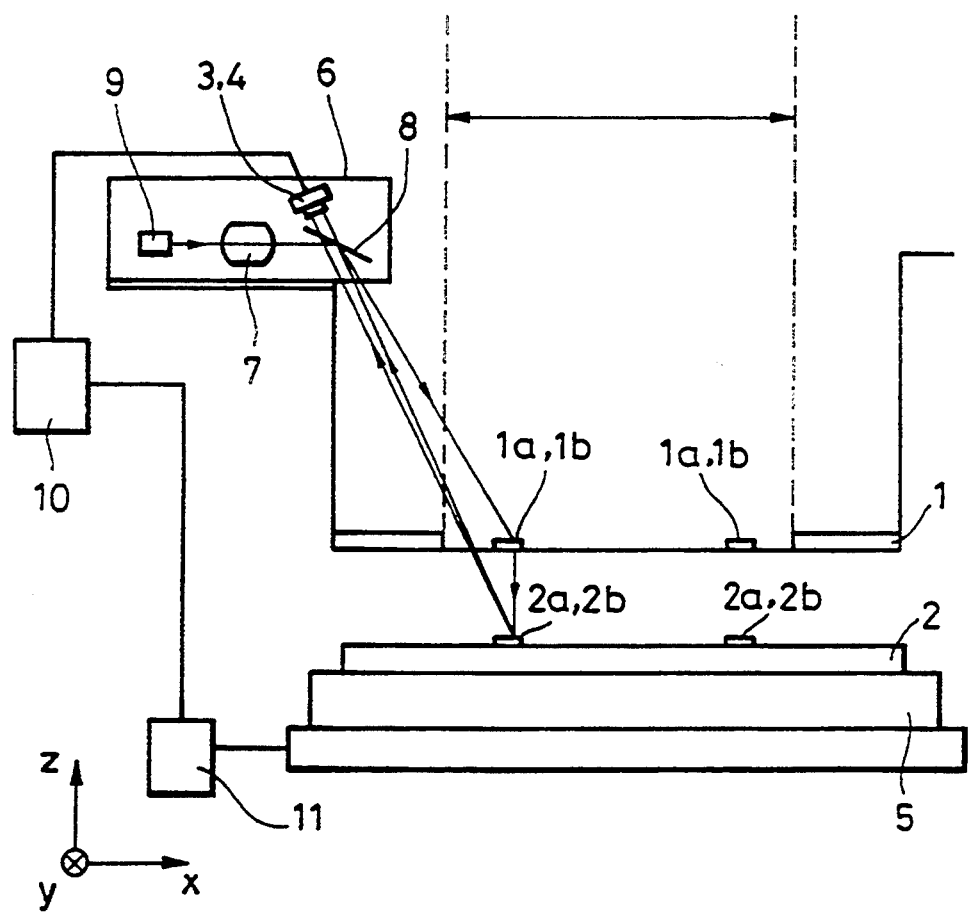
FIG. 5 illustrates a schematic view of a semiconductor exposure apparatus to which the auto-alignment detection method of the present invention is applied.

FIG. 5 illustrates the structure of a first embodiment of the present invention in which the above-described positional deviation detection is applied to a proximity type semiconductor manufacturing apparatus. The wafer 2 is placed on a wafer stage 5. Offset from and above the mask 1 is disposed a pick-up casing 6. The pick-up casing 6 incorporates therein a light source 9 for illuminating the mask 1 and the wafer 2 with the first and second signal light rays B1 and B2 which are projected through a collimator lens (or a beam diameter changing lens) 7 and a projection light ray bending mirror 8, as well as the detecting portions 3 and 4 of the apparatus. The light from light source 9 passes through lens 7, is reflected by mirror 8, passes through mask 1, is reflected by wafer 2 and then is transmitted through mirror 8 to detecting portions 3 and 4 of the apparatus. The outputs of the detecting portions 3 and 4 are supplied to a signal processing unit 10. The output of the signal processing unit 10 is used by a wafer stage driving. unit 11 co move the wafer stage 5 such that the positional deviation is, for example, zero. Alignment between the mask 1 and the wafer 2 is thus performed. Exposure is performed in this aligned state.

In this case, detection of the relative positional deviation between the mask 1 and the wafer 2 is performed in the manner described above. In this embodiment, the movement distance of the incident positions on the detecting portions 3 and 4 relative to the positional deviation $\epsilon$ between the mask 1 and the wafer 2 can be set between $100.\epsilon$ and $500.\epsilon$. If the movement magnification of the incident positions to the positional deviation between the mask 1 and the wafer 2 is set to, for example, 500, when the movement distance detected on the detecting portions 3 and 4 is 1 $\mu$m, $1/500=0.002$ $\mu$m can be detected as the positional deviation $\epsilon$ between the mask 1 and the wafer 2. Thus, highly accurate detection of the positional deviation is made possible.

Figure 6:
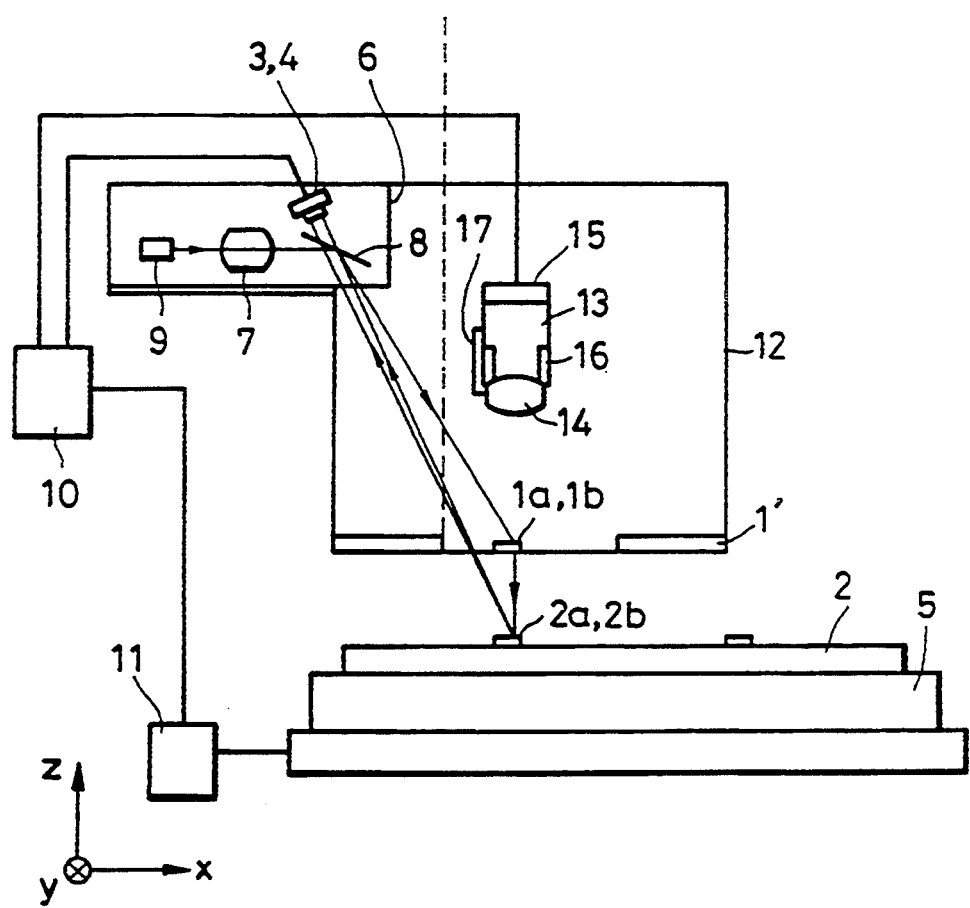
FIG. 6 illustrates a schematic view of the structure of a first embodiment according to the present invention.

FIG. 6 illustrates the essential parts of the first embodiment which includes a surface space measuring unit. In FIG. 6, members which correspond to those shown in FIGS. 3 and 5 are designated by the same reference characters.

The casing 6 and the members incorporated therein (the sensors 3 and 4, the light source 9, the lens 7 and the half mirror 8), shown in FIG. 6, are separate length measuring members which have the same function and structure as those of the casing 6 for alignment and the members incorporated therein, shown in FIG. 5.

Above the wafer 2 which is an object to be detected is disposed a casing 12 which incorporates an alignment optical system and a mask 1' as one unit. The casing 12 is movable relative to the wafer 2. In the casing 12 is disposed a surface space measuring device 13 for measuring the space between the length measuring mask 1' having marks 1a and 1b, like the mask 1, and the wafer 2. This surface space measuring device 13 includes a lens system 14, a CCD camera 15, a lens driving system 16 and a displacement gauge 17 for measuring the amount by which the lens system 14 is displayed. The relation between the marks 1a and 1b of the mask 1' and the surface space measuring device 13 is obtained beforehand when the apparatus is assembled by an actual measurement, because they are fixed within the same casing 12.

Figure 7:
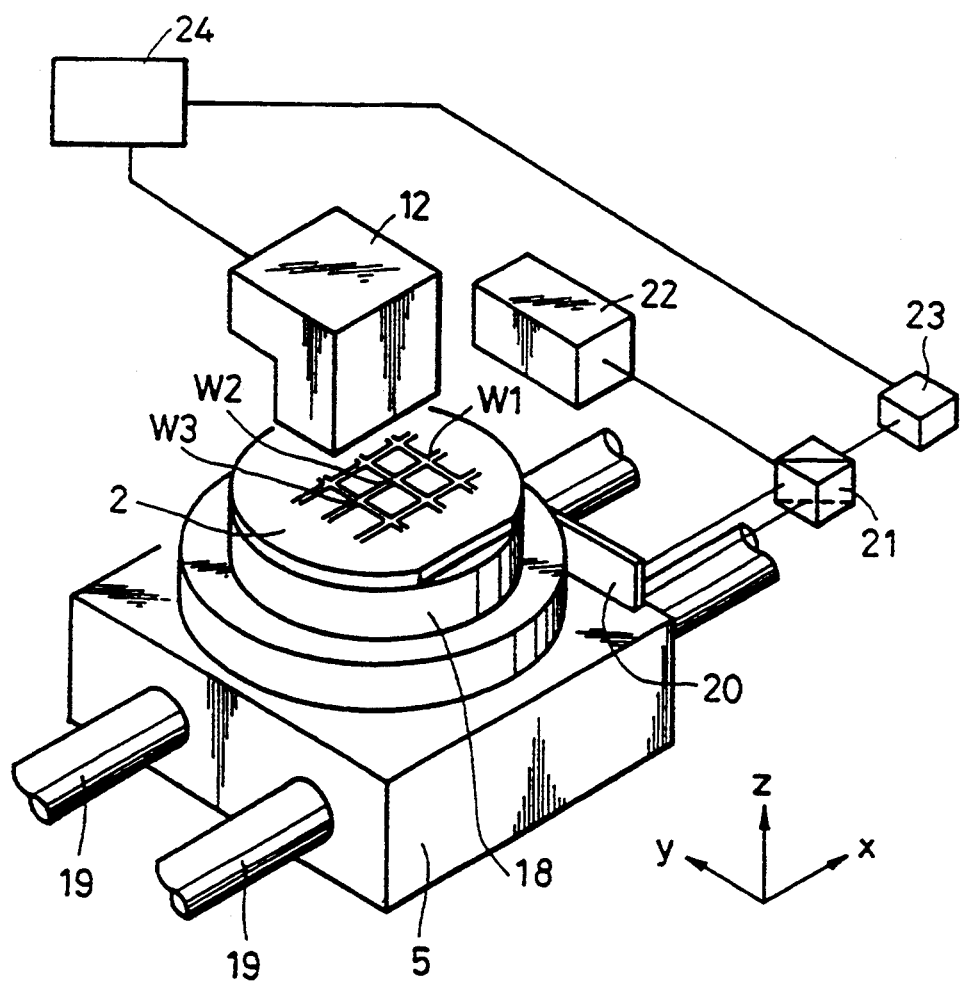
FIG. 7 is a perspective view of the embodiment of FIG. 6.

FIG. 7 is a perspective view of the essential parts shown in FIG. 6. The wafer 2 held by a wafer chuck 18 is placed on the wafer stage 5 which is movable along guides 19 in one direction. A mechanism for moving the wafer stage 5 in the direction of the y axis is not shown. If it is desired to move the wafer 2 in the direction of the y axis, a stage movable in the direction of the y axis and a length measuring device for measuring the movement length of the stage in the direction of the y axis are provided below the stage 5. To measure the movement distance, a reflection mirror 20 is mounted on the stage 5. Rays of light emanating from a length measuring light source 22 are projected onto the mirror 20 through a prism 21. The light reflected by the reflecting mirror 20 is made incident on a length measuring device 23, which is an interferometer, through the prism 21. The output of the length measuring device 23 is displayed on a display 24 as the amount of movement of the stage 5 in the direction of the x axis without change.

How the length measurement is performed for patterns will now be described.

The wafer 2 has patterns W1, W2, W3 . . . , corresponding to the alignment marks 2a and 2b, printed at certain intervals thereon. The results of the printing distortion of the exposure apparatus for printing these patterns and those of the process distortion are obtained as the output of the length measuring device 23. The length measuring device 23 successively outputs signals representing the amounts of movement of the wafer stage 5. When the length measuring device outputs an alignment signal, such a signal represents zero positional deviation achieved when the stage 5 is moved relative to the casing 12 having the mask 1', and the patterns on the mask 1' are aligned with the patterns W1, W2, W3 . . . on the wafer 2 in sequence. That is, the measured intervals of the patterns W1, W2, W3 . . . of the wafer 2 contain the sum of the alignment detection errors and the detection errors of the length measuring device 23 (which are small values due to high-accuracy).

In this embodiment, the mask 1', having the patterns corresponding to the alignment marks 1a and 1b, is provided in the casing 12, and the wafer 2 has thereon the patterns W1, W2, W3 . . . as the alignment marks 2a and 2b. In this case, although the in-plane deviations of the patterns can be detected a surface space detection function between the marks 1a, 1b and the marks 2a, 2b is not provided. Hence, the surface space measuring device 13 is provided in the casing 12. The lens system 14 is provided at a predetermined position corresponding to the set space between the alignment marks 1a, 1b of the mask 1' and the alignment marks 2a, 2b of the wafer 2 such that it can be focused on the marks 2a and 2b. The entirety of the wafer chuck 18 is moved up or down by a upward/downward driving system, not shown, such that the images of the marks 2a and 2b become sharp. The surface space measuring device 13 may also be provided outside the casing 12.

A surface space detection method, an application on which has been filed by the present applicants, may be employed in place of the surface space measuring device 13 shown in FIG. 6. In this case, not only the marks for alignment but also marks for surface space measurement are formed on the mask 1' shown in FIG. 6. In this surface space detection method, rays of light are made incident on a grating on the mask 1', and the rays of light which have been diffracted in a predetermined direction by a physical optical element are reflected by the surface of the wafer 2. The reflected light is directed to a detecting portion of the apparatus. The space between the mask 1' and the wafer 2 is obtained by detecting the incident position of the rays of light on the detecting portion.

In FIG. 7, although an illustration of a driving system for the wafer stage 5 is not shown, a conventional driving system is used. Also, to measure the movement distance not only in the direction of the x axis but also in the direction of the y axis, another casing is provided in the structure shown in FIG. 7 in such a manner that it can detect the movement length in the y direction. Alternatively, the positional deviation detection function along both x and y axes can be performed by one casing by setting the grating shown in FIGS. 2 and 3 such that it has a lens function of a two-dimensional power or of a toric asymmetric power. In FIG. 6, the wafer 2 is moved, and the movement distance thereof is measured. However, it may also be arranged such that the wafer 2 is made fixed while the casing is made movable in both x and y directions with the length measuring devices provided accordingly.

Figure 8:
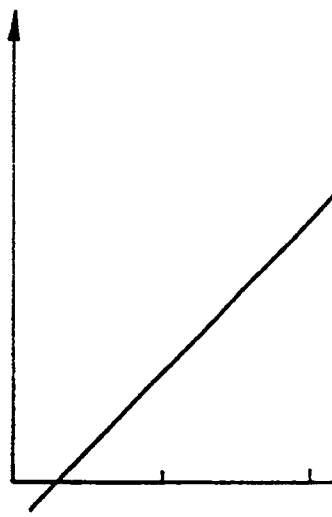
FIG. 8 is a graph showing the auto-alignment characteristics of the present invention.

In the case where the spaces between the patterns W1, W2, W3 . . . on the wafer 2 are measured using an auto-alignment signal and the signal from the length measuring device 23, as shown in FIG. 7, the positional deviation e between the mask 1 and the wafer 2 and the auto-alignment signal (positional deviation signal $S_1-S_2$) has a substantially linear relation and hence a one-to-one correspondence, as shown in FIG. 8. Therefore, it is not necessary for the signals of the length measuring device 23 to be sampled when the alignment signal is exactly zero. An alignment signal corresponding to a certain positional deviation in the vicinity of zero deviation is determined beforehand, and the spaces between the patterns W1, W2, W3 . . . may be obtained by sampling the signal of the length measuring device 23 each time the auto-alignment signal is obtained.

In this way, alignment detection errors can be reduced to 1 to 2 nm, as mentioned above, and it is thus possible for the length measuring device 23 to have a detection accuracy of about 0.01 $\mu$m, like the laser interferometer manufactured by Hewlet Packard. In general, it is possible to measure the spaces between the patterns W1, W2, W3 at an accuracy of 0.01 $\mu$m (theoretical value).

The data on the two spaces can be used to obtain data, such as data on elongation, shrinkage, or distortion, caused by the manufacturing process, of the patterns formed on the wafer 2. The thus-obtained data may be utilized for controlling the printing magnification which is performed by a temperature adjusting device provided within the wafer chuck, not shown, before a subsequent wafer printing process is conducted. That is, the aforementioned space measurement may be performed on the previously printed pattern immediately before a printing process is performed on the wafer 2 to obtain data representing the elongation or distortion of each of the regions on the wafer 2. If it is found on the basis of the obtained data that each of the regions of the wafer on which printing is to be performed does not have an adequate size relative to the pattern on the mask 1 to be printed, the temperature adjusting device controls, during the printing process, the temperature of that region such that it can be expanded or contracted to an adequate size. Alignment and printing are performed thereafter. In this way, more accurate printing can be performed.

Figure 9:
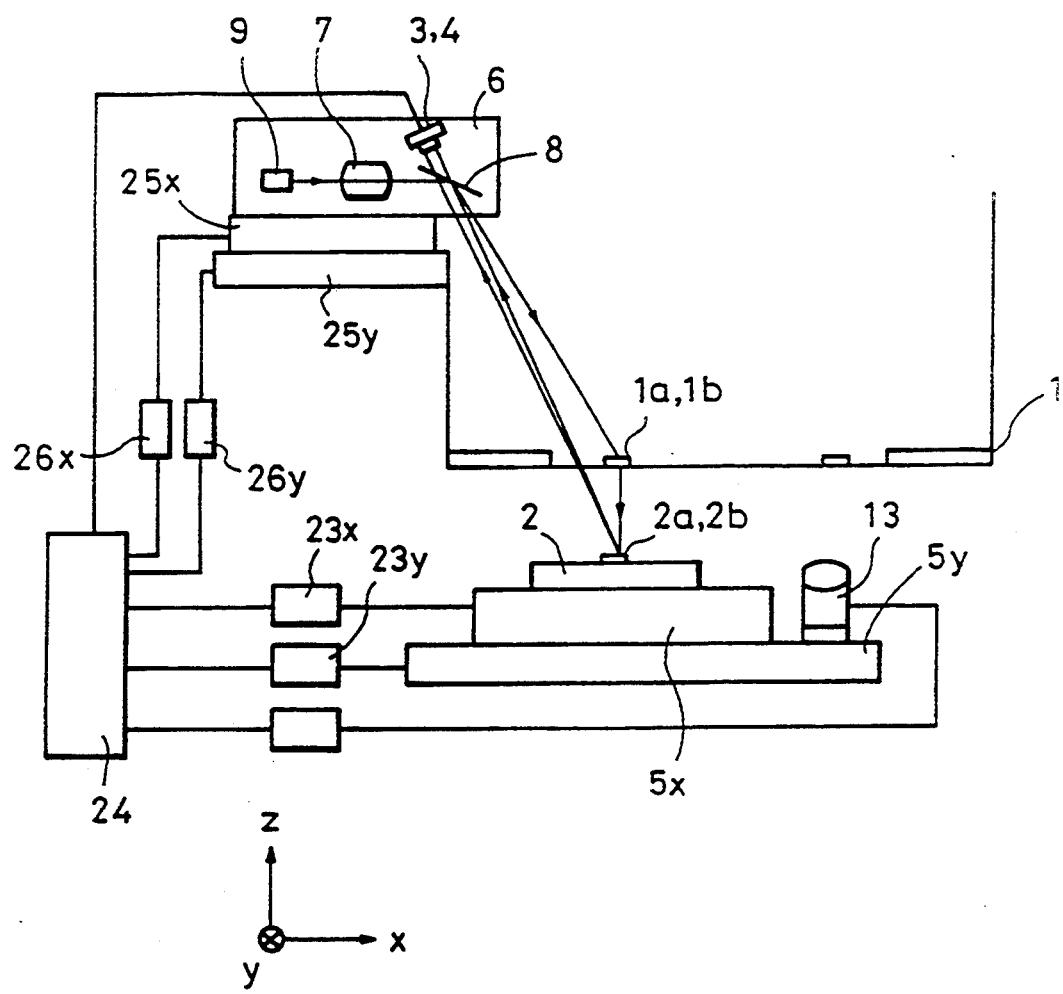
FIG. 9 illustrates a schematic view of the structure of a second embodiment of the present invention.
Figure 10:
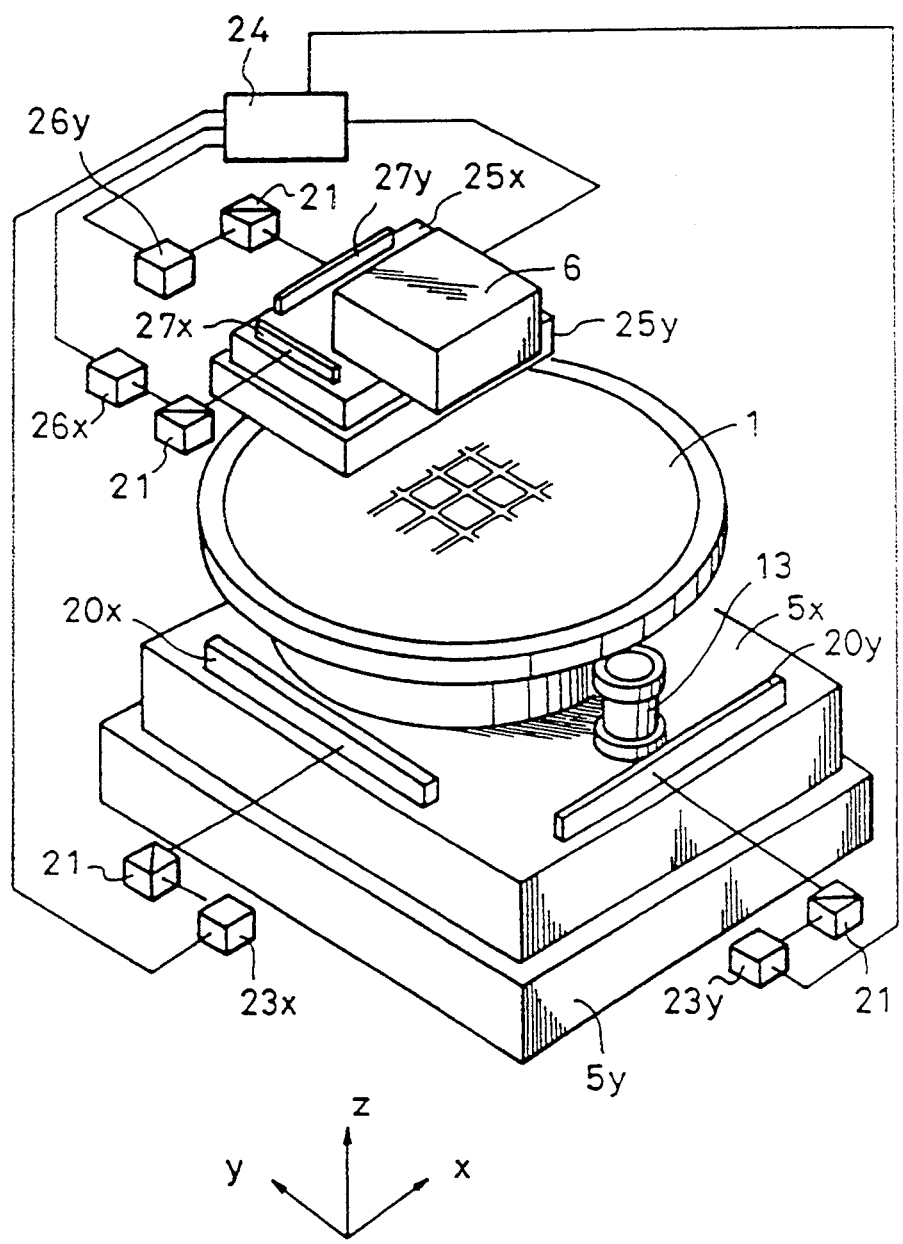
FIG. 10 is a perspective view of the second embodiment of FIG. 9.

FIGS. 9 and 10 illustrate another embodiment of the present invention. Identical reference numerals in these figures to those in FIGS. 5–7 represent similar or identical elements. The wafer 2 is placed on stages 5x and 5y, and the mask 1, having a plurality of patterns (each of which has the alignment patterns 1a and 1b), is disposed above the wafer 2. The casing 6 is fixedly mounted on scanning stages 25x and 25y. The amounts of movement of the stages 5x and 5y are measured by length measuring devices 23x and 23y, respectively, while the amounts of movement of the stages 25x and 25y are measured by length measuring devices 26x and 26y, respectively. The outputs of the length measuring devices 23x, 23y, 26x and 26y are connected to a display 24. Length-measuring reflection mirrors 20x and 20y are provided on the stages 5x and 5y, while length-measuring reflection mirrors 27x and 27y are provided on the stages 25x and 25y. The surface space measuring device 13 for measuring the distance between the mask 1 and the wafer 2 is provided on the stage 5y. In this embodiment, the casing 6 and the members incorporated therein are used for both alignment shown in FIG. 5 and the length measurement for the patterns, which will be described later, unlike the case of the first embodiment.

First, the casing 6 is moved by means of the stages 25x and 25y so that a laser beam can illuminate a predetermined pattern within the measuring pattern area on the mask 1, and the laser beam is then projected on a relatively wide area around the alignment marks of the objective pattern on the mask. Thereafter, the wafer 2, on which the pattern corresponding to the alignment marks 2a and 2b is formed, is moved by driving the stages 5x and 5y. Since the laser beam is projected onto the wide area, even if the mask and the casing 6 are not aligned with each other with a high degree of accuracy, the state of the light diffracted by the alignment marks on the mask and irradiating the wafer is always constant. When the pattern on the wafer 2 is moved to a position just below the measuring pattern on the mask 1 and a zero auto-alignment signal is thereby output on the basis of the aforementioned principle for measurement, that position of the stage 5x is read from the output of the length-measuring device 23x. Next, the casing 6 is moved to a position where it projects a laser beam on the pattern on the mask 1 adjacent to the previous pattern, and the wafer 2 is then moved. The output of the length measuring device 23x when the auto-alignment signal is zero is read out. The difference between the outputs of the length measuring device 23x is the distance between the alignment patterns on the mask 1 in the x direction.

Similarly, length measurement between the patterns on the mask 1 can also be performed in the y direction. The output of the length measuring device when the auto-alignment signal is zero has been read in the above-described method. However, length measurement between the patterns can be achieved by selecting any signal value within the positional deviation detection stroke in which the positional deviation is detectable and by reading the outputs of the length measuring devices 23x and 23y relative to the positions of the stages 5x and 5y, which are obtained each time the selected signal value is output.

Thus, the present embodiment utilizes the diffracted signal of the object to be detected, and hence has an advantage in that the expansion or contraction of the spaces between the patterns on the mask 1 or reticle which are illuminated with the exposure light by the exposure apparatus can be measured. In recent years, the integration of the semiconductor devices has increased, increasing the demand for a reduction in the distortion of the mask pattern. Under these circumstances, measurement of the spaces between the patterns on the mask 1 independently of the exposure apparatus and quantitative evaluation of the pattern distortion caused by, for example, heat of the exposure light when the mask is mounted on the exposure apparatus are therefore essential. The present invention offers a simple method which can meet the above-described demand. According to the present invention, it is possible to measure the spaces between the patterns on the mask with a high degree of accuracy by providing elements on the wafer stage which correspond to the wafer patterns used for auto-alignment, unlike the aforementioned case, or by utilizing the special auto-alignment patterns on the wafer, like the aforementioned case.

In a case where the space between the patterns W1 and w2 on the mask 1 is set to a certain value beforehand, if the distortion of the mask 1 is zero, the spaces between the patterns are measured using the sum of the errors of the alignment optical system and the detection errors of the length measuring devices 23x and 23y contained therein. As mentioned above, alignment detection errors are about 1 to 2 nm, and this allows the length measuring devices 23x and 23y to measure the space between the patterns W1 and W2 with a degree of accuracy of about 0.01 μm, like the laser interferometer manufactured by, for example, Hewlett Packard.

In the structure shown in FIG. 9, illumination light is incident on the mask 1 obliquely. However, it may be made incident perpendicular to the mask 1. Furthermore, although the wafer 2 is moved, it may be fixed while the mask 1 is made movable so as to allow the amount of movement of the mask 1 to be measured. In this case, the layout of the optical system is suitably changed such that it can measure the amount of movement of the mask.

The aforementioned apparatus adopts the alignment method (1). However, either of the alignment methods (2), (3) and (5) mentioned in Description of the Related Art can be used. In all these methods, the aforementioned conditions (a), (b), (c) and (d) are common. Furthermore, not only the proximity type alignment system but also the projection type alignment system, used for a photo stepper, can be used.

In the structure shown in FIGS. 9 and 10, the space between the pattern on the mask 1 and the pattern on the wafer 2 is detected by the surface space measuring device 13. However, the surface space detection method, which has been described by the present applicants in application Ser. No. 770,138, may be employed in place of the surface space measuring device 13. In that case, not only the marks for alignment but also marks for surface space measurement are formed. In this surface space detection method, rays of light are made incident on a pattern mark which is a grating on the mask 1, and the resultant rays of light which have been diffracted in a predetermined direction by a physical optical element comprising the pattern mark are reflected by the surface of the wafer 2. The reflected light is directed to a detecting portion of the apparatus. The space between the mask 1 and the wafer 2 is obtained by detecting the incident position of the rays of light on the detecting portion.

Figure 11:
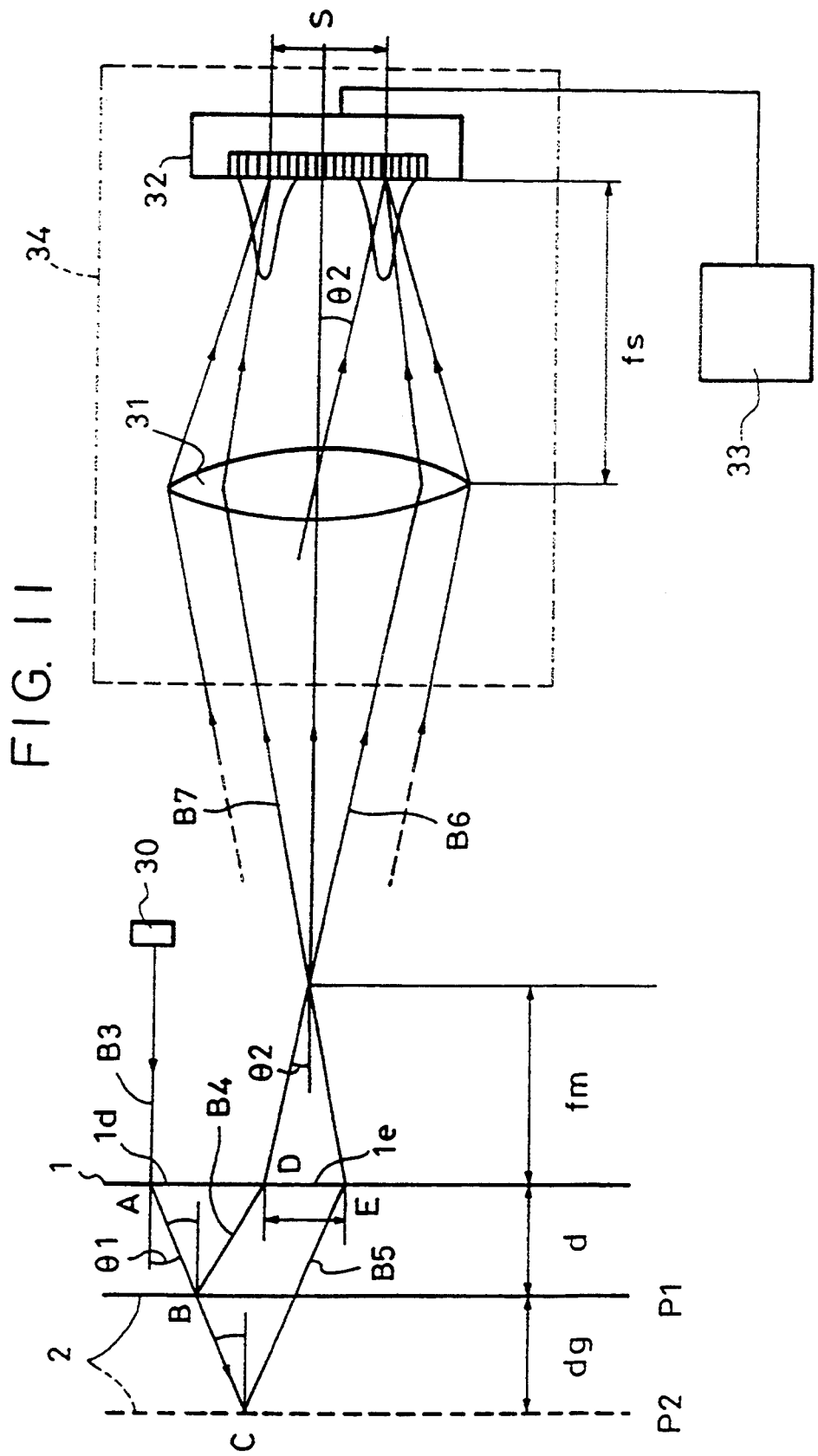
FIG. 11 illustrates a schematic view of the detection principle of a surface space detection method of the present invention.
Figure 12:
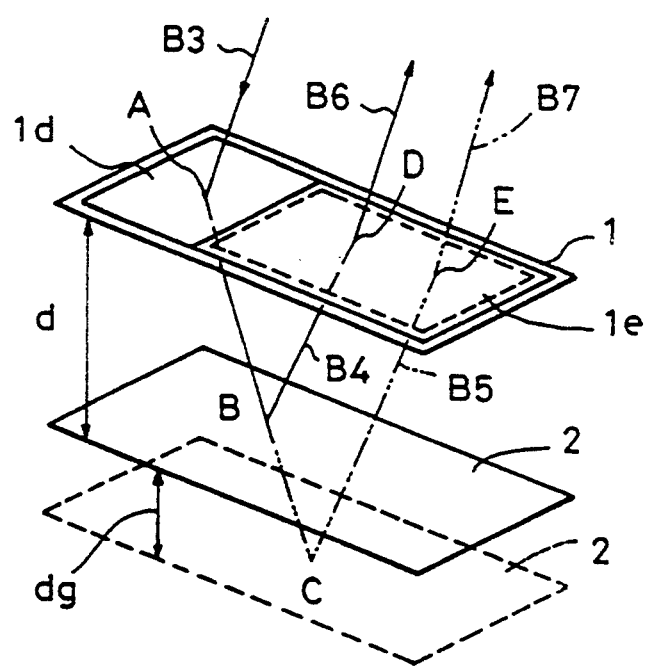
FIG. 12 illustrates a schematic view of the surface space detection method of the present invention.

FIGS. 11 and 12 illustrate the space detection method of the present invention. A He—Ne laser light source or a semiconductor laser light source 30 emits a light beam B3. The mask 1 and the wafer 2 are spaced from each other by a space d. A condenser lens 31 having a focal length of fs and a light-receiving element or portion 32 are disposed in opposed relation to the mask 1. The output of the light-receiving portion 32 is connected to a signal processing circuit 33 which obtains the position of the center of gravity of the light beam incident on the surface of the light-receiving portion 32 and thereby calculates the space d between the mask 1 and the wafer 2 in the manner to be described later. The condenser lens 31, the light-receiving portion 32 and the signal processing circuit 33, if necessary, are incorporated in a probe 34, which is made movable relative to the mask 1 and the wafer 2.

The light beam B3 having a wavelength λ of 830 nm and generated from the semiconductor laser light source 30 is made incident on point A on a first Fresnel zone plate (hereinafter referred to as a FZP) 1d on the surface of the mask 1 perpendicular thereto. Light diffracted by the first FZP 1d at angle θ1 and having a predetermined order of diffraction is reflected by the surface of the wafer 2 at point B (C). A resultant reflected light B4 is that obtained when the wafer 2 is located at position P1 close to the mask 1. A reflected light B5 is that obtained when the wafer 2 is located at position P2 which is displaced from position P1 by a distance dg. Next, the light reflected by the wafer 2 is made incident on a second FZP 1e on the mask 1 at point D (E). The second FZP 1e has the optical function of changing the angle of the diffracted light emanating therefrom according to the incident position of the incident light beam. Diffracted light beams B6 or B7 diffracted by the second FZP 1e at an angle of θ2 and having a predetermined order of diffraction are directed to the light-receiving portion 32 through the condenser lens 31. The space d between the mask 1 and the wafer 2 is calculated using the centers of gravity of the incident light beams B6 and B7 on the light-receiving portion 32.

The first and second FZPs 1d and 1e are provided on the mask 1 at a predetermined known pitch. The diffraction angles θ1 and θ2 of the light beam incident thereon, e.g., of the diffracted light having ± primary order of diffraction, are known.

Figure 13A:
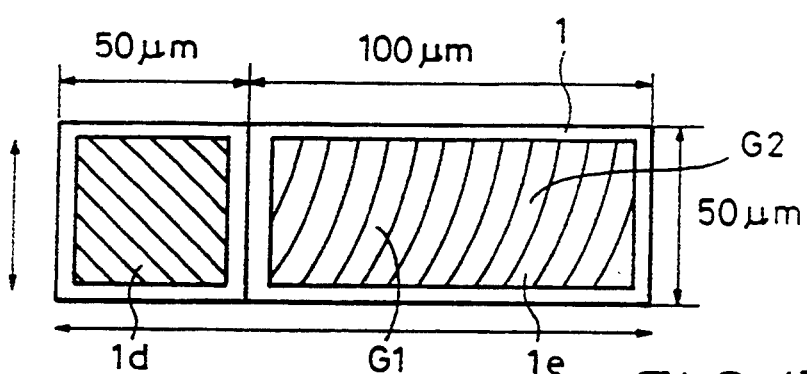
FIGS. 13 (a), 13 (b), and 13 (c) illustrate schematic views of the surface space detection method of the present invention.
Figure 13B:
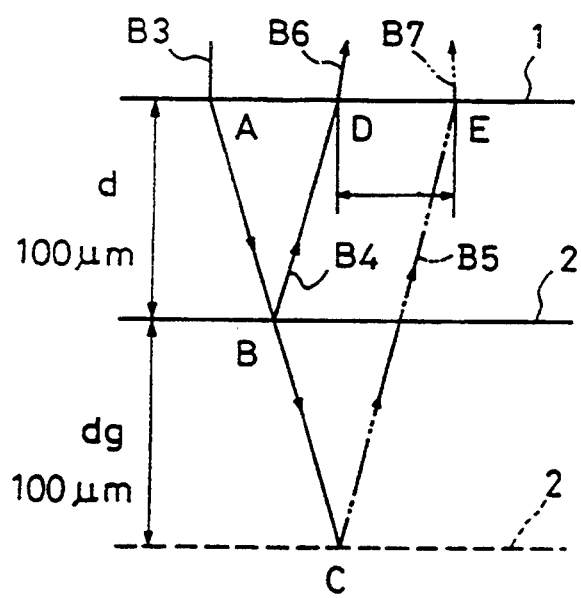
Figure 13C:
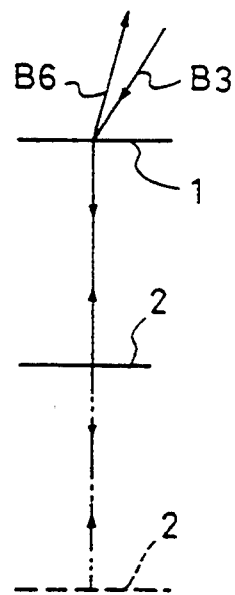

FIGS. 13 (a), 13 (b), 13 (c) illustrate the relation between the function of the first and second FZPs 1d and 1e on the mask 1 and the space between the mask 1 and the wafer 2. The first FZP 1d has the function of bending the incident light. However, it may also have the function of converging or diverging the incident light. As shown in FIGS. 13 (a), 13 (b) and 13 (c), the second FZP 1e is structured such that the diffraction direction is gradually changed depending on the position of light incident thereon. For example, point G1 is a point through which the center of gravity of the light beam emanating from the second FZP 1e passes when the spaced between the mask 1 and the wafer 2 is 100 μm. As the space d between the mask 1 and the wafer 2 increases, the point through which the light beam emanating from the second FZP 1e passes moves rightward, as viewed in FIG. 13 (a). When the space d is 200 μm, the light beam passes through point G2.

Although the pattern of the FZP 1d has neither a converging nor diverging power in the vertical direction, as viewed in FIG. 13 (a), it may have such a power so that it can adjust expansion of the light beam. Furthermore, in the horizontal direction, as viewed in FIG. 13 (a), the FZP 1d has a converging power for directing a light beam in the direction of an emitting angle of 5° at a distance fm of 1000 μm, as shown in FIG. 11. In a case where the space measuring range between the mask 1 and the wafer 2 is between, for example, 100 μm and 200μm in FIG. 13, the area is set accordingly.

Figure 14:
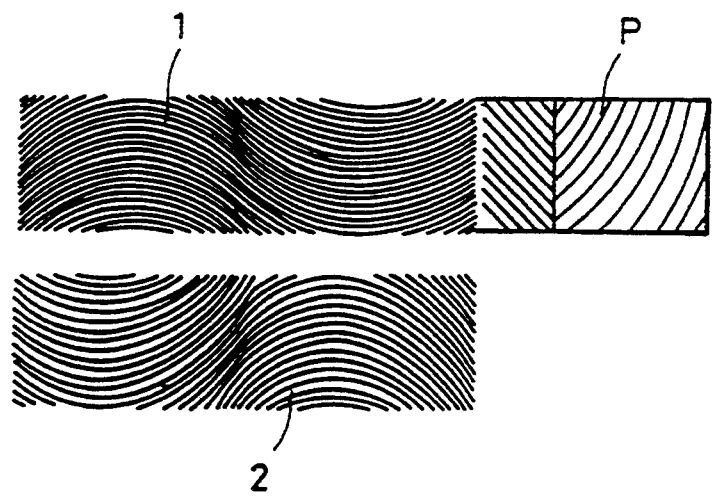
FIG. 14 is a plan view of patterns having both an auto-alignment detection function and a surface space detection function.

Both alignment patterns and surface space detection patterns may be set in place of the alignment marks 1a and 1b or 2a and 2b shown in FIGS. 9 and 10. FIG. 14 illustrates examples of such a mask 1 and a wafer 2. If a surface space detecting pattern P is provided on the mask 1, as shown in FIG. 14, the space between the mask 1 and the wafer 2 can be measured without using the surface space measuring device 13 shown in FIG. 9.

The alignment method (1) has been described. However, any of the other alignment methods (2) through (5) can be performed by exactly the same structure as that used in the alignment method (1), as mentioned above. How, for example, the alignment method (4) is performed will be described.

Figure 15:
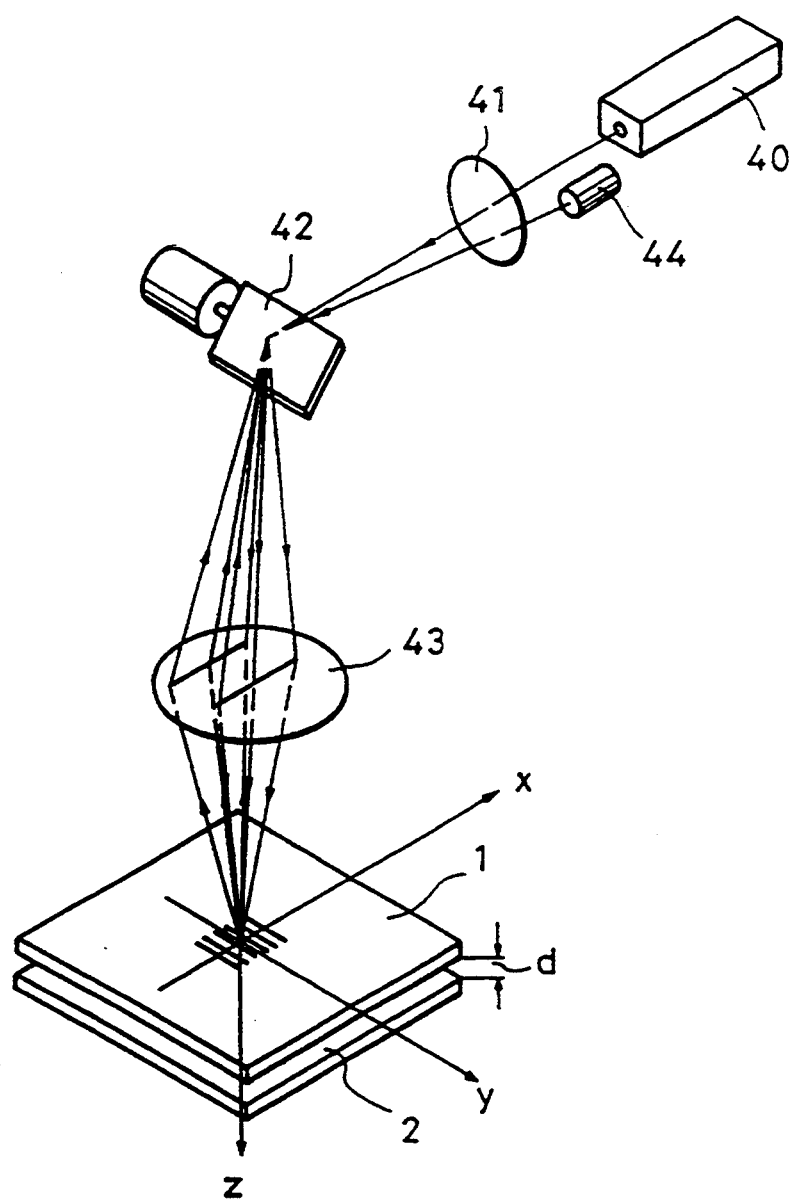
FIG. 15 illustrates a schematic view of another auto-alignment detection method of the present invention.

FIG. 15 illustrates the alignment method for aligning the mask 1 and the wafer 2 which has been described in Journal of Vacuum Science and Technology 16(6) November/December 1979 P 1954. Rays of light emanating from a laser light source 40 pass through a lens 41, and are then made into an elongated sheet beam by a scanner 42. The sheet beam is projected, through a lens 42, onto the mask 1 and the wafer 2.

Figure 16:
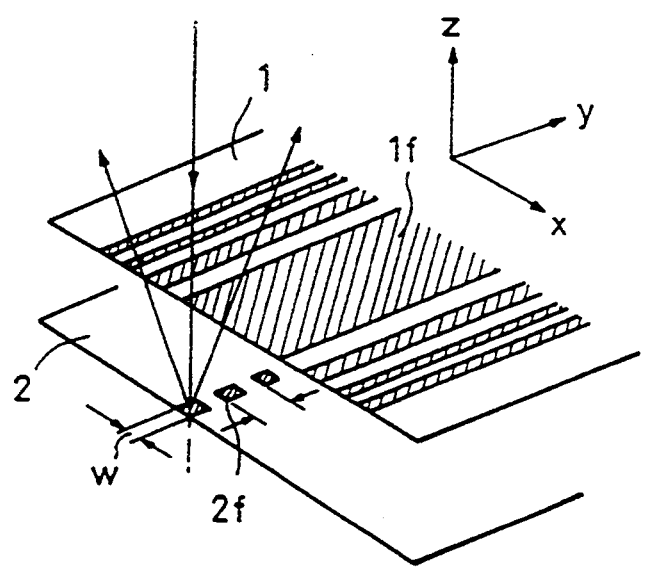
FIGS. 16 (a) and 16 (b) illustrate schematic views of the detection method of the present invention.
Figure 16:
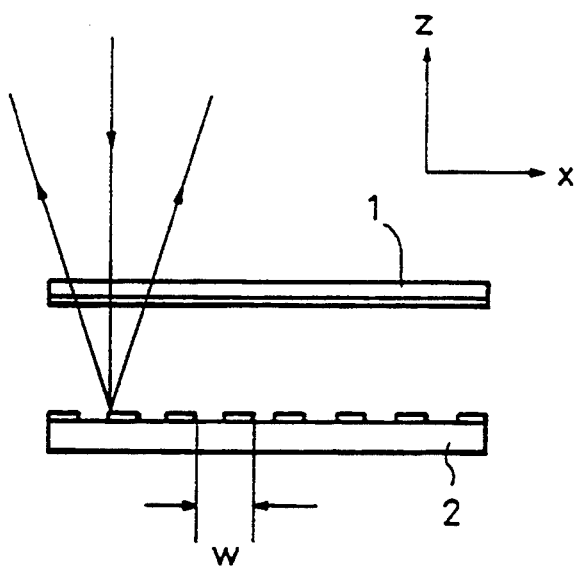

The mask 1 has thereon a grating pattern If having a power only in one direction in one dimension, as shown in FIG. 16 (a), like a cylindrical lens. The wafer 2 has a sequence-of-points grating pattern $2f$ formed in the y direction. FIG. 16 (b) is a side view of this portion.

When there is no positional deviation between the mask 1 and the wafer 2 in the x direction, rays of light condensed into a sheet beam by the grating pattern $1f$ on the mask 1 are diffracted by the pattern $2f$. The diffracted sheet beam returns to the lens 43 again and then reaches a photo diode 44 through the lens 41, as shown in FIG. 15.

Figure 17A:
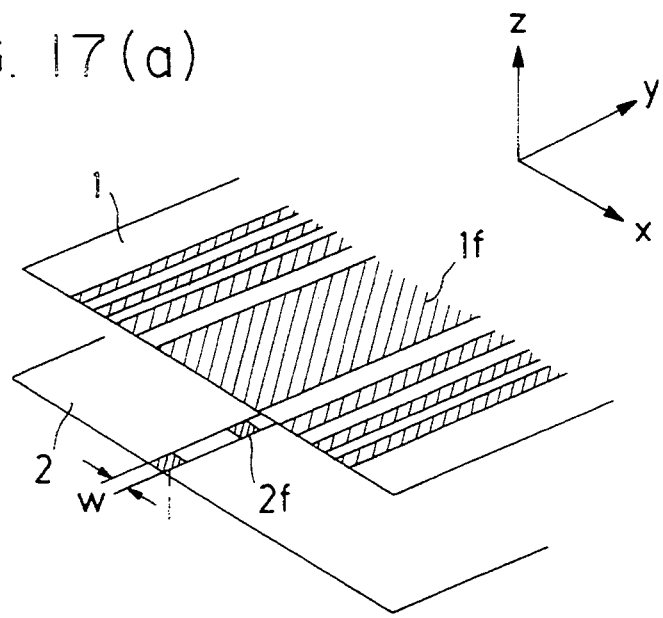
FIGS. 17 (a), 17 (b), and 17 (c) illustrate schematic views of the detection method of the present invention.
Figure 17B:
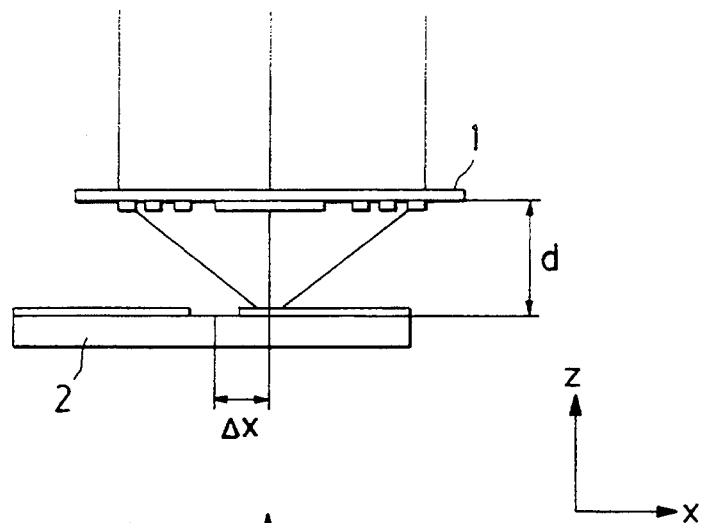
Figure 17C:
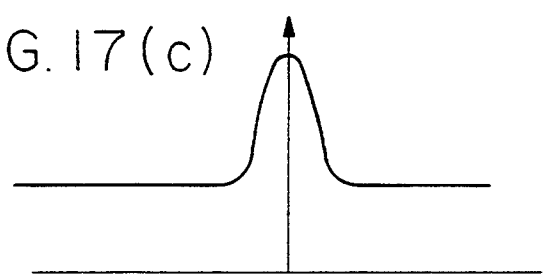

If there is a positional deviation between the mask 1 and the wafer in the x direction, the light condensed by the pattern $1f$ on the mask 1 does not correctly strike the pattern $2f$ on the wafer 2, as shown in FIGS. 17 (a) and 18 (b), reducing the amount of light diffracted by the pattern $2f$ or generating no diffracted light. Thus, the intensity of light which reaches the photo diode 44 is less.

This relation is illustrated in FIGS. 17 (b) and 17 (c). $\Delta x$ is a positional deviation between the mask 1 and the wafer 2. If the width of the pattern $2f$ is, for example, 1 to 2 μm, the width of the signal generating the reflected light shown in FIG. 17 (c) in the direction of $\Delta x$ is 1 to 2 μm, and determination of the peak value of this width allows for detection of the positional deviation of the order of 0.01 μm. Hence, in this alignment method, the pattern if is formed on the mask 1 and the pattern $2f$ is formed on the wafer 2 in the embodiment of this invention shown in FIG. 9.

At that time, the focal length of the pattern $1f$ on the mask 1 is set to the space d between the mask 1 and the wafer 2. If the space between the mask 1 and the wafer 2 deviates from the predetermined space, the intensity of light incident on the pattern $2f$ decreases. Consequently, this alignment method has the function of detecting the surface space between the mask 1 and the wafer 2.

Thus, the alignment method (4) can be performed by employing a structure similar to that shown in FIG. 10. In this case, the photo probe of the casing 6 is replaced by the device shown in FIG. 15 and the mask 1 has different patterns. The pattern on the wafer 2 is changed into a sequence-of-points pattern.

As mentioned above, it is possible to measure the space between the patterns with a high degree of accuracy by moving a unit in which an alignment optical system and a mask corresponding pattern member are incorporated relative to the object to be detected, such as a wafer, and by measuring the amount of movement.

Figure 18:
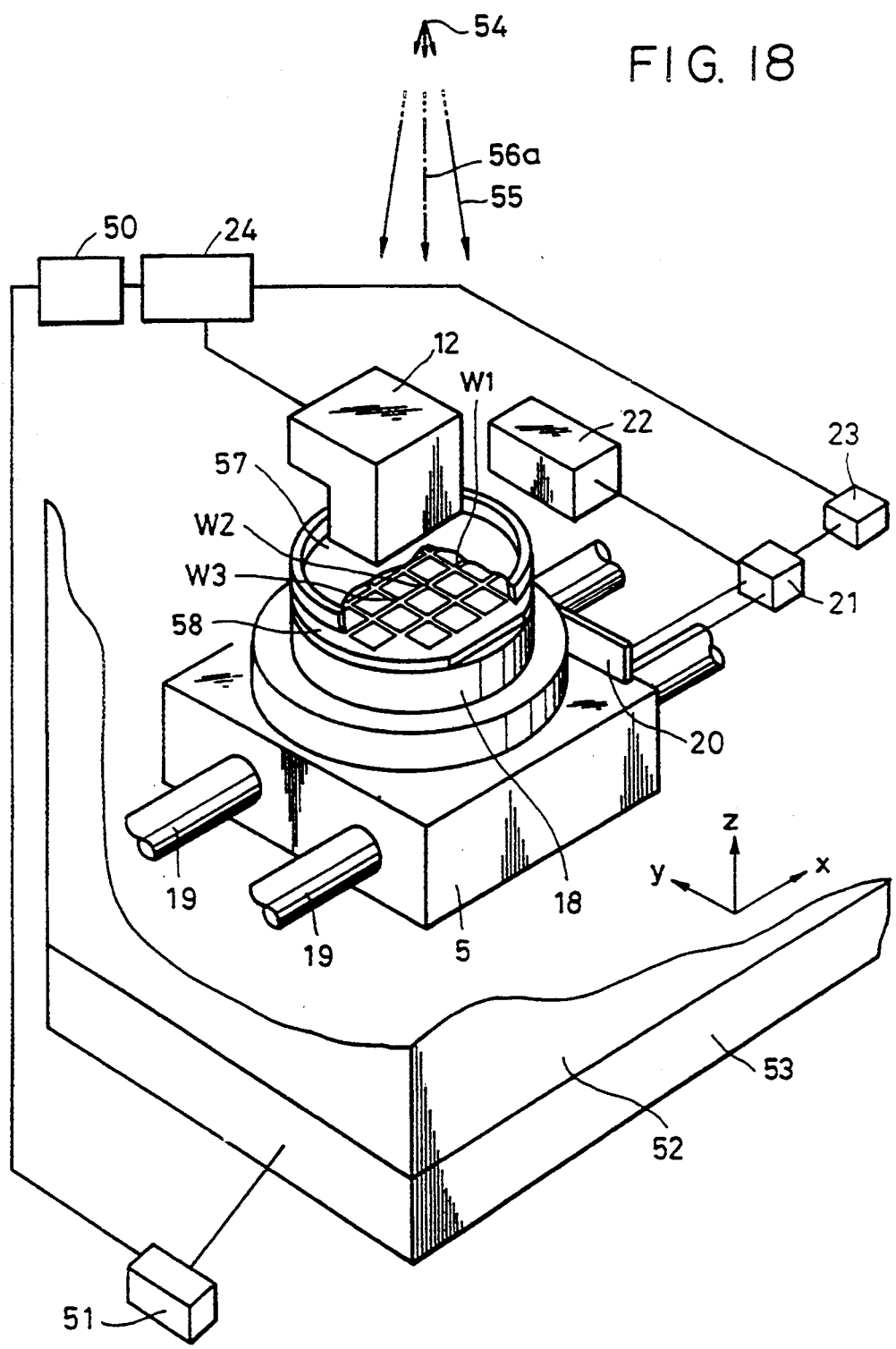
FIG. 18 illustrates a perspective view of the structure of an apparatus to which the present invention is applied.
Figure 19:
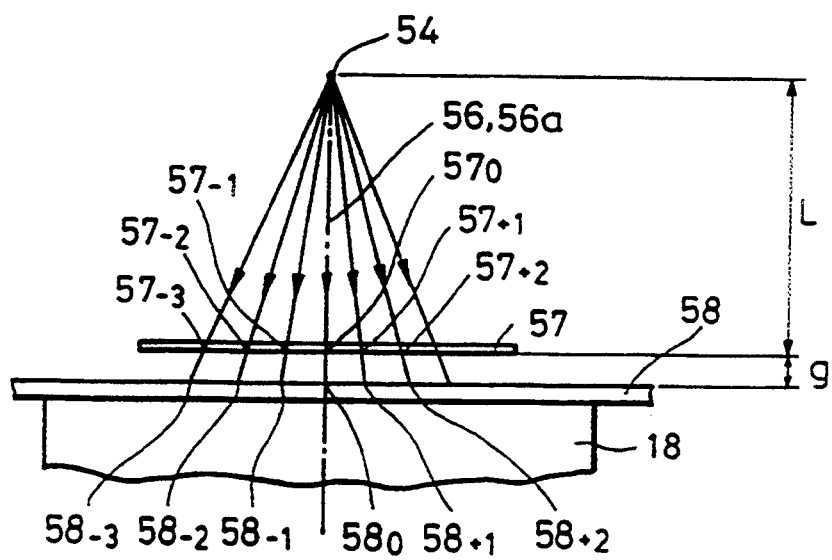
FIG. 19 illustrates the positional relation between a point light source and a mask/a wafer.
Figure 20:
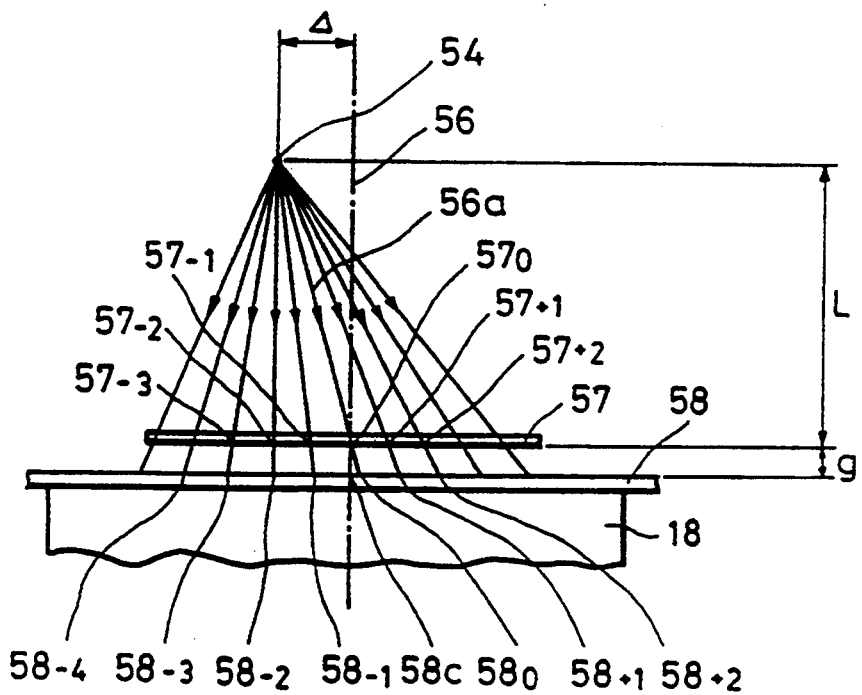
FIG. 20 illustrates the positional relation between the point light source and the mask/wafer.
Figure 21:
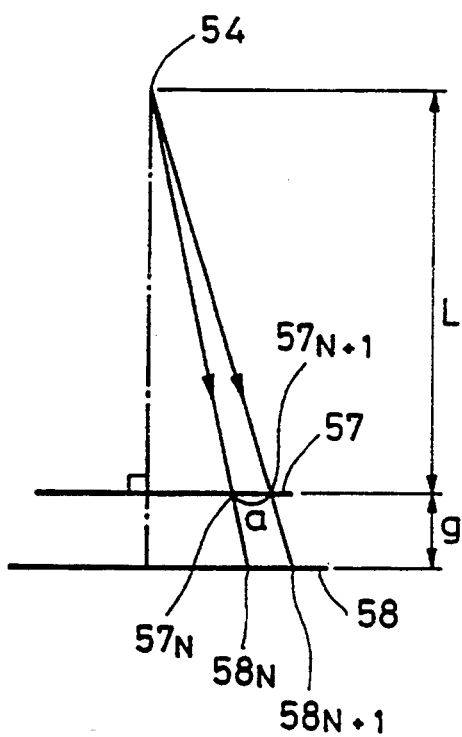
FIG. 21 illustrates a space between printed patterns.

How the results of the measurement of the space between the patterns can be utilized in an X-ray lithography operation which employs a SOR (synchrotron orbital radiation) as a radiation source will be described below. The SOR is regarded as a point light source located at an approximately far distance. The relation between the SOR and the exposure apparatus which adopts this embodiment will be explained with reference to FIG. 18. In FIG. 18, reference characters 54 and 55 respectively denote a point light source of SOR and irradiated X-rays (so-called exposed X-rays). The same reference characters are used to denote members of FIG. 18 which are the same as those shown in FIG. 6. 50 is a controller receiving the outputs of the length measuring device 23 and casing 12 and for controlling a drive circuit 51 for driving mechanism 53. In FIG. 18, illustration of the casing provided for alignment, such as that shown in FIG. 5, is omitted. Reference character 56a denotes a line which connects the X-ray source 54 with the center of the pattern area on an X-ray mask 57 placed in an exposure apparatus 52. Before the exposure operation is started, the center of the pattern area on the mask 57 must be aligned with the X-ray source. At this time, the aforementioned results of the measurement of the space between the patterns are utilized in the manner described below with reference to FIGS. 19 and 20 which are side elevational views of a mask and a wafer. In FIG. 19, the line 56a, which connects the center $57_0$ of the pattern area on the mask 57 with the point light source 54, coincides with a normal 56 to the surface of the mask 57 at the pattern area center $57_0$. Generally, the desired state of the relationship between the point light source 54 and the mask 57 is a state in which the line 57a coincides with the normal 56 to the surface of the mask at the pattern area center $57_0$, shown in FIG. 19. However, an undesired state in which the point light source 54 is not on the normal 56 at the pattern area center $57_0$, shown in FIG. 20, may be obtained due to an unsatisfactory setting of the mask. A determination of the state the apparatus presently occupies among the states shown in FIGS. 19 and 20 and correction thereof are performed in the manner described below using the means of measuring the space between the patterns according to the present invention. That is, a predetermined mask having patterns $57_{-3}$, $57_{-2}$, ... $57_0$ ... $57_{+1}$, $57_{+2}$ formed thereon at the same interval is exposed on a test wafer using the SOR source, and the spaces between the patterns formed on the wafer are measured using the detection device according to the present invention. A positional deviation $\Delta$ between pattern area center $57_0$ and the normal 56 is obtained on the basis of the measured spaces, and an X-ray stepper 52 is then moved relative to the SOR point light source 54 by a driving mechanism 53 by the deviation $\Delta$ so as to obtain the positional relation shown in FIG. 19. This will be further explained in detail. In the state shown in Fig. 20, intervals between patterns $58_{-3}$, $58_{-2}$, $58_{-1}$, $58_0$, $58_{+1}$ formed on a wafer 58 as a result of printing the patterns $57_{-3}$, $57_{-2}$, $57_{-1}$, $57_0$. . . $57_{+1}$ . . . formed on the mask 57 at the same interval are non-uniform. In the positional relation shown in FIG. 19, this non-uniformity of the intervals is symmetrical with respect to a center $58_c$ of the pattern area of a printing area on the wafer 58 which is formed by one exposure operation (one shot). However, when there exists a positional deviation $\Delta$ between the point light source 54 of SOR and the normal to the surface of the mask 57 at the center of the pattern area, as shown in FIG. 20, the non-uniformity of the intervals is asymmetrical with respect to the center $58_c$ of the pattern area provided by one shot. These non-uniform intervals are distributed symmetrically with respect to the point at which the X-rays from the point light source are made incident perpendicular thereto. Therefore, the space between the center of symmetry of the distribution of the non-uniform intervals of the patterns printed on the wafer and the center $58_c$ of the wafer is regarded as $\Delta$. This symmetrical center is obtained on the basis of the measured value, and a positional deviation between the obtained center and the pattern area center 58c is detected. The stepper body 52 shown in FIG. 18 is moved by the driving system 53 by the detected deviation to obtain a desired setting state. Space 'b' between pattern $58_N$ and pattern $58_{N+1}$ printed on the wafer 58 when the space between pattern $57_N$ and adjacent pattern $57_{n+1}$ on the mask 57 is 'a' will be obtained as follows:

$$b = \frac{L+g}{L} \cdot a$$

where L is the distance between the mask 57 and the line source 54 and g is the space between the mask 57 and the wafer 58.

If L=5 m, g=100 μm and a=1 mm, b = 1.00002 mm

Thus, we have b − a = 0.00002 mm = 0.02 μm

Practically, W1, W2, W3 are printed on the wafer by the SOR point light source 54 using the mask 57 having the patterns W1, W3, W3 formed thereon at the same intervals, shown in FIG. 18, (at this time, the casing 12 is retracted). After the wafer is developed, the mask 57 is removed and the wafer is placed on the chuck 18 again. The casing 12 is disposed at the position shown in FIG. 6 and the spaces between W1, W2, W3 . . . are measured by the aforementioned length measuring system. A positional deviation Δ shown in FIG. 19 is measured on the basis of the measured values of the non-uniform spaces between the patterns, and the stepper 52 is moved by the measured deviation by the driving mechanism 54 such that a predetermined relation (shown in FIG. 19) can be obtained.

As will be understood from the foregoing description, the length measuring device and the exposure apparatus according to the aforementioned embodiments employ, as a photo probe, the auto-alignment detection means. The first object having the alignment patterns and the second object are moved relative to each other, and the amount of movement is read with a high degree of accuracy. The space between the patterns formed on the second object which is to be detected is measured with a high degree of accuracy on the basis of the value which is read.

The individual components represented by the blocks shown in FIGS. 5–7, 9–11, 15, and 18 are well known in the exposure apparatus and length measuring apparatus art and their operation is not critical to the invention or the best mode for carrying out the invention. Moreover, the steps for carrying out the length measurement and alignment operations discussed in the specification can be easily programmed into well known central processing units by persons of ordinary skill in the art and since such programming per se is not part of the invention, no further description thereof is deemed necessary.

What is claimed is:

1. A length measuring device for performing length measurement on a first object which is an object to be detected, said first object having a plurality of alignment patterns thereon; said device comprising:

alignment detection means for detecting the relative positional relation between the first object and a second object having a plurality of reference alignment patterns used for aligning the first object therewith, said alignment detection means detecting an alignment condition between the alignment patterns of the first and second objects;

movement means for moving the first and second objects relative to each other;

measurement means for measuring the amount of movement of said movement means; and length measurement means for performing measurement of the space between the plurality of alignment patterns formed on the first object, said length measurement means performing length measurement on the basis of successive alignment conditions detected by successive alignment condition detection operations of said alignment detection means between the plurality of reference alignment patterns on the second object and the plurality of alignment patterns on the first object, as well as the amount of movement of said movement means measured by said measurement means during the successive alignment condition detection operations of said alignment detection means.

2. The length measuring device according to claim 1, wherein said alignment detection means includes a light source for generating inspection rays of light, and a photo detection element for detecting the inspection rays of light which have passed through at least one alignment pattern on the first object and at least one reference alignment pattern on the second object, said alignment detection means optically detecting the alignment condition between the alignment patterns of the first and second objects.

3. The length measuring device according to claim 2, wherein said alignment detection means detects the alignment condition from a position on said photo detection element on which the inspection rays of light are incident.

4. The length measuring device according to claim 2, wherein said alignment detection means detects the alignment condition from the intensity of light of the inspection rays of light incident on said photo detection element.

5. An exposure apparatus for performing an exposure operation on a first object which is an object to be detected, the first object having a plurality of alignment patterns thereon; said apparatus comprising:

alignment detection means for detecting the relative positional relation between the first object and a second object having a plurality of reference alignment patterns used for aligning the first object therewith, said alignment detection means detecting an alignment condition between the alignment patterns on the first and second objects;

movement means for moving the first and second objects relative to each other, said movement means performing movement of the first and second objects such that the first and second objects are aligned with each other on the basis of the result of detection by said alignment detection means, wherein an exposure operation is conducted on the aligned first and second objects;

measurement means for measuring the amount of movement of said movement means; and length measurement means for performing measurement of the space between the plurality of patterns formed on the first object, said length measurement means performing length measurement on the basis of successive alignment conditions detected by successive alignment condition detection operations of said alignment detection means between the plurality of reference alignment patterns on the second object and the plurality of alignment patterns on the first object, as well as the amount of movement of said movement means measured by said measurement means during the successive alignment condition detection operations of said alignment detection means.

6. The exposure apparatus according to claim 5, wherein said alignment detection means includes a light source for generating inspection rays of light, and a photo detection element for detecting the inspection rays of light which have passed through at least one alignment patterns on the first object and at least one reference alignment pattern on the second object, said alignment detection means optically detecting the alignment condition between the alignment patterns of the first and second objects.

7. The exposure apparatus according to claim 6, wherein said alignment detection means detects the alignment condition from a position on said photo detection element on which the inspection rays of light are incident.

8. The exposure apparatus according to claim 6, wherein said alignment detection means detects the alignment condition from the intensity of light of the inspection rays of light incident on said photo detection element.

9. A length measuring device for performing length measurement on a first object which is an object to be detected, said first object having a plurality of alignment patterns, said device comprising:

an alignment detection optical system for detecting the relative positional relation between the first object and a second object having reference alignment patterns used for aligning the first object therewith, said alignment detection optical system optically detecting an alignment condition between the alignment patterns of the first and second objects;

a stage for moving the first and second objects relative to each other;

a measuring unit for measuring the amount of movement of said stage; and a length measuring unit for performing measurement of the space between the plurality of alignment patterns formed on the first object, said length measuring unit performing length measurement on the basis of successive alignment conditions detected by successive alignment condition detection operations of said alignment detection optical system between the plurality of reference alignment patterns on the second object and the plurality of alignment patterns on the first object, as well as the amount of movement of said stage measured by said measuring unit during the successive alignment condition detection operations of said alignment detection optical system.

10. A length measuring apparatus for performing measurement of a space between a plurality of alignment marks on a first object, the plurality of alignment marks comprising at least one pattern, said apparatus comprising:

alignment detection means for detecting the relative positional relation between the first object and a second object having reference alignment mark, which comprises at least one pattern, used for aligning the first object therewith, said alignment detection means detecting an alignment condition between the plurality of alignment marks and the reference alignment mark;

movement means for moving the first and second objects relative to each other;

measurement means for measuring the amount of movement of said movement means; and length measurement means for performing measurement of the space between the plurality of alignment marks formed on the first object, said length measurement means performing length measurement on the basis of successive alignment conditions detected by successive alignment condition detection operations of said alignment detection means between the reference alignment mark on the second object and the plurality of alignment marks on the first object, as well as the amount of movement of said movement means measured by said measurement means during the successive alignment condition detection operations of said alignment detection means.

11. The length measuring apparatus according to claim 10, wherein said alignment detection means includes a light source for generating inspection rays of light, and a photo detection element for detecting the inspection rays of light which have passed through the at least one pattern and at least one alignment pattern of the reference alignment mark, said alignment detection means optically detecting the alignment condition between the at least one pattern and the reference alignment mark.

12. The length measuring apparatus according to claim 11, wherein said alignment detection means detects the alignment condition from a position on said photo detection element on which the inspection rays of light are incident.

13. The length measuring apparatus according to claim 11, wherein said alignment detection means detects the alignment condition from the intensity of light of the inspection rays of light incident on said photo detection element.

14. An exposure apparatus for performing an exposure operation on a first object which has a plurality of alignment marks thereon, the plurality of alignment marks comprising at least one pattern, said apparatus comprising;

alignment detection means for detecting the relative positional relation between the first object and a second object having a reference alignment mark, which comprises at least one pattern, used for aligning the first object therewith, said alignment detection means detecting an alignment condition between the plurality of alignment marks and the reference alignment mark;

movement means for moving the first and second object relative to each other, said movement means performing movement of the first and second objects such that the first and second objects are aligned with each other on the basis of the result of the detection by said alignment detection means, wherein an exposure operation is conducted on the aligned first and second objects;

measurement means for measuring the amount of movement of said movement means; and length measurement means for performing measurement of the space between the plurality of alignment marks formed on the first object, said length measurement means performing length measurement on the basis of successive alignment conditions detected by successive alignment condition detection operations of said alignment detection means between the reference alignment mark and the plurality of alignment marks, as well as the amount of movement of said movement means measured by said measurement means during the successive alignment condition detection operations of said alignment detection means.

15. The exposure apparatus according to claim 14, wherein said alignment detection means includes a light source for generating inspection rays of light, and a photo detecting element for detecting the inspection rays of light which have passed through the at least one pattern and at least one pattern of the reference alignment mark, said alignment detection means optically detecting the alignment condition between the at least one pattern and the reference alignment mark.

16. The exposure apparatus according to claim 15, wherein said alignment detection means detects the alignment condition from a position on said photo detection element on which the inspection rays of light are incident.

17. The exposure apparatus according to claim 15, wherein said alignment detection means detects the alignment condition from the intensity of light of the inspection rays of light incident on said photo detection means.

* * * * *

UNITED STATES PATENT AND TRADEMARK OFFICE
CERTIFICATE OF CORRECTION

PATENT NO. : 5,440,394                              Page 1 of 3
DATED      : August 8, 1995
INVENTOR(S): NORIYUKI NOSE, et al.

It is certified that error appears in the above-indentified patent and that said Letters Patent is hereby corrected as shown below:

ON THE COVER PAGE

At [56] References Cited

Foreign Patent Documents

"1101630 4/1989 Japan
1108741 4/1989 Japan
1191421 8/1989 Japan
1200620 8/1989 Japan" should read
--1-101630 4/1989 Japan
1-108741 4/1989 Japan
1-191421 8/1989 Japan
1-200620 8/1989 Japan--.

Other Publications

"Patent Abstracts of Japan, vol. 12, No. 293, on" should read --Patent Abstracts of Japan, vol. 12, No. 293, an--.
"Optical Engineereing, vol. 22, No. 2, Mar/Apr. 1983, pp. 203-207, "Application of Zone Plates to Alignment in X-Ray Litography"" should read --Optical Engineering, vol. 22, No. 2, Mar/Apr. 1983, pp. 203-207, "Application of Zone Plates to Alignment in X-Ray Lithography"--.

COLUMN 2

Line 39, "apse," should read --aspect,--.

UNITED STATES PATENT AND TRADEMARK OFFICE
CERTIFICATE OF CORRECTION

PATENT NO. : 5,440,394

DATED : August 8, 1995

INVENTOR(S) : NORIYUKI NOSE, et al.

It is certified that error appears in the above-indentified patent and that said Letters Patent is hereby corrected as shown below:

COLUMN 3

Line 10, "patterns" should read --pattern--.

COLUMN 5

Line 49, "Hei 1-1630," should read --Hei 1-101630--.

COLUMN 6

Line 54, "{(L" should read --(L--.
Line 56, "{(L" should read --(L--.

COLUMN 7

Line 55, "deviation e" should read --deviation $\epsilon$--.

COLUMN 9

Line 1, "co" should read --to--.

COLUMN 11

Line 5, "deviation e" should read --deviation $\epsilon$--.
Line 16, "signal-is" should read --signal is--.
Line 21, "Hewlet" should read --Hewlett--.

UNITED STATES PATENT AND TRADEMARK OFFICE
CERTIFICATE OF CORRECTION

PATENT NO. : 5,440,394  Page 3 of 3
DATED : August 8, 1995
INVENTOR(S) : NORIYUKI NOSE, et al.

It is certified that error appears in the above-indentified patent and that said Letters Patent is hereby corrected as shown below:

COLUMN 15

Line 35, "pattern if" should read --pattern 1f--.

COLUMN 16

Line 24, "center 570" should read --center $57_0$--.
Line 52, "center $58_c$" should read --58c--.

COLUMN 17

Line 6, "pattern $57_{n+1}$" should read --pattern $57_{N+1}$--.

COLUMN 19

Line 14, "patterns" should read --pattern--.
Line 66, "reference" should read --a reference--.

Signed and Sealed this

Twenty-eighth Day of November 1995

Attest:

BRUCE LEHMAN

*Attesting Officer*   Commissioner of Patents and Trademarks